United States Patent
Shimada

(10) Patent No.: US 9,628,733 B2
(45) Date of Patent: Apr. 18, 2017

(54) IMAGE PICKUP DEVICE, IMAGE PICKUP APPARATUS

(71) Applicant: OLYMPUS CORPORATION, Hachioji-shi, Tokyo (JP)

(72) Inventor: Yoshinao Shimada, Hino (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 14/876,389

(22) Filed: Oct. 6, 2015

(65) Prior Publication Data

US 2016/0112626 A1     Apr. 21, 2016

(30) Foreign Application Priority Data

Oct. 15, 2014   (JP) ................................ 2014-210910

(51) Int. Cl.

| | |
|---|---|
| *H04N 5/347* | (2011.01) |
| *H04N 5/369* | (2011.01) |
| *H04N 5/378* | (2011.01) |
| *H03M 1/12* | (2006.01) |
| *H03M 1/46* | (2006.01) |
| *H04N 9/04* | (2006.01) |

(52) U.S. Cl.
CPC .......... *H04N 5/3696* (2013.01); *H04N 5/347* (2013.01); *H03M 1/124* (2013.01); *H03M 1/468* (2013.01); *H04N 5/378* (2013.01); *H04N 9/045* (2013.01)

(58) Field of Classification Search
CPC ...... H04N 5/3696; H04N 5/347; H04N 9/045; H04N 5/378; H03M 1/1245; H03M 1/466; H03M 1/687; H03M 1/007; H03M 1/0604; H03M 1/0697
See application file for complete search history.

(56) References Cited

U.S. PATENT DOCUMENTS

| | | | | |
|---|---|---|---|---|
| 4,519,080 | A * | 5/1985 | Snyder, Jr. ............ | H03M 13/43 714/793 |
| 6,861,634 | B2 * | 3/2005 | Rossi ..................... | H04N 5/378 250/208.1 |
| 7,236,415 | B2 * | 6/2007 | Forbes ................... | G11C 7/062 365/189.15 |
| 7,525,349 | B2 * | 4/2009 | Mavoori ............... | H03F 1/0277 324/76.83 |
| 7,706,201 | B2 * | 4/2010 | Liaw ....................... | G11C 5/02 365/163 |
| 2005/0018060 | A1 * | 1/2005 | Takayanagi .......... | H04N 5/3651 348/241 |

FOREIGN PATENT DOCUMENTS

| | | |
|---|---|---|
| JP | 2010-020055 | 1/2010 |
| JP | 2013-110607 | 6/2013 |

* cited by examiner

*Primary Examiner* — Hung Lam
(74) *Attorney, Agent, or Firm* — John C. Pokotylo; Straub & Pokotylo

(57) ABSTRACT

An image pickup device includes a pixel unit which generates pixel signals for image and pixel signals for focus detection, a first memory unit which stores the pixel signals for image, a second memory unit which stores the pixel signals for focus detection, a pixel signal synthesizing unit which synthesizes the pixel signals for image from a plurality of pixel signals, and an image signal outputting unit which outputs the pixel signals for image synthesized by the pixel signal synthesizing unit and the pixel signals for focus detection stored in the second memory.

11 Claims, 22 Drawing Sheets

FIG. 11

IMAGE PICKUP DEVICE, IMAGE PICKUP APPARATUS

CROSS REFERENCE TO RELATED APPLICATION

This application claims benefit of Japanese Application No. 2014-210910 filed in Japan on Oct. 15, 2014, the entire contents of which are incorporated herein by this reference.

BACKGROUND OF THE INVENTION

1. Field of the Invention

The present invention relates to an image pickup device in which pixels are arranged in a matrix and which generates pixel signals for image and pixel signals for focus detection, and an image pickup apparatus.

2. Description of the Related Art

In recent years, an image pickup device in which pixels are arranged in a matrix and which generates pixel signals for image and pixel signals for focus detection has been proposed. Such an image pickup device includes, for example, a configuration in which pixels for focus detection are discretely arranged among pixels for image arranged in a matrix, and a configuration in which a plurality of photo diodes are provided within one pixel, so that both pixel signals for image and pixel signals for focus detection are obtained from one pixel.

Further, while a high-resolution image is desired for a still image, an image with fixed resolution (fixed number of pixels) with a frame rate of, for example, 30 fps or 60 fps is desired to be acquired for a movie. Therefore, upon acquisition of a movie, or the like, the number of pixels to be read out is reduced through pixel addition, so as to reduce time required for readout and improve a frame rate.

Also in an image pickup device having pixels for focus detection, a technique of performing pixel addition has been proposed.

For example, Japanese Patent Application Laid-Open Publication No. 2010-20055 discloses an image pickup apparatus having an addition readout mode in which output of a plurality of pixels within an image pickup device is added and read out, and if a group of pixels to be added includes only pixels for image pickup, the pixels are added, while if the group of pixels to be added includes pixels for focus detection, signals of a group of pixels for image pickup and signals of pixels for focus detection are read out so as not to be mixed with each other.

Further, Japanese Patent Application Laid-Open Publication No. 2013-110607 discloses a technique of, in an image pickup device including a pixel having a micro lens, a plurality of photoelectric conversion regions disposed for each pixel, and addition means for adding signals in the photoelectric conversion regions disposed for each pixel, setting an addition readout region in which a plurality of pixels are arranged in two dimensions of a horizontal direction and a vertical direction and which outputs a signal obtained by adding the signals of the photoelectric conversion regions out of the plurality of pixels by the addition means, and an independent readout region which outputs a signal without addition of the signals of the photoelectric conversion regions by the addition means, and making the number of pixels in a horizontal direction of the addition readout region identical with that of the independent readout region.

Pixel addition which has been conventionally performed will be described with reference to FIG. 5 and FIG. 7 to FIG. 9 according to embodiments of the present invention.

First, it is assumed that, for example, as shown in FIG. 7, a configuration of a pixel unit 21 in which pixels having photo-diodes are arranged in a matrix is basically a primary color Bayer array (here, diagonal hatching from upper left to lower right indicates green pixels, vertical hatching indicates red pixels, and horizontal hatching indicates blue pixels), and pixels for focus detection R, L, T and B are discretely arranged in the primary color Bayer array. Further, as shown in FIG. 5, an image pickup device includes an analog memory unit 22 which respectively stores analog pixel signals read out from the pixel unit 21, pixel signals are read out for each row from the memory unit 22, and a plurality of pixel signals within one row are converted into digital signals simultaneously at a column-parallel AD converter 25.

FIG. 8 shows an example of V2/2 H2/2 addition, and FIG. 9 shows an example of V1/5 H3/3 addition. Here, pixel addition is performed so that pixel signals of the same color are added, and V indicates a vertical direction, H indicates a horizontal direction, a denominator indicates for each of how many pixels of the same color pixels in an array are added, and a numerator indicates the number of pixels to be added.

In the case of V2/2 H2/2 addition shown in FIG. 8, pixel signals of the same color of all the pixels are added for each of 2×2 pixels in the vertical direction and in the horizontal direction, and converted into digital signals by the column-parallel AD converter 25.

In the case of V1/5 H3/3 addition shown in FIG. 9, pixel signals of one in every five rows are converted into digital signals by the column-parallel AD converter 25, and three pixels of pixel signals of the same color converted into the digital signals are added in the horizontal direction.

By the way, the number of times of operation of the column-parallel AD converter 25 largely affects a frame rate of an image, and generally, time required for reading out an image is proportional to the number of times of operation of the column-parallel AD converter 25.

Therefore, while, in the case of V2/2 H2/2 addition, it requires readout time of the same level as that in the case of readout of all the pixels, in the case of V1/5 H3/3 addition, because it requires readout time of approximately ⅕ of that in the case of readout of all the pixels or the V2/2 H2/2 addition, it is possible to increase a frame rate by substantially 5 times.

SUMMARY OF THE INVENTION

An image pickup device according to one aspect of the present invention includes a pixel unit in which pixels are arranged in a matrix, and, further, when a plurality of the pixels which are adjacent are regarded as unit pixels, the unit pixels are arranged in a matrix, and which generates pixel signals for image and pixel signals for focus detection, a pixel signal synthesizing unit which generates pixel signals for image by synthesizing at least the pixel signals for image generated from pixels within the unit pixels, a first analog memory which stores the synthesized pixel signals for image generated by the pixel signal synthesizing unit when the pixel signal synthesizing unit is disposed before the first analog memory, and which stores at least the pixel signal for image read out from the pixel unit when the pixel signal synthesizing unit is disposed after the first analog unit, a second analog memory which stores the pixel signals for focus detection, and an image signal outputting unit which outputs as image signals, the synthesized pixel signals for image read out from the first analog memory when the pixel signal synthesizing unit is disposed before the first analog memory, or the synthesized pixel signals for image generated by the pixel signal synthesizing unit when the pixel signal synthesizing unit is disposed after the first analog memory, and the pixel signals for focus detection stored in the second analog memory.

An image pickup apparatus according to one aspect of the present invention includes the image pickup device, an image pickup optical system which forms an optical image on the image pickup device and for which a focus position can be adjusted, and a focus detection control unit which adjusts the focus position of the image pickup optical system based on pixel signals for focus detection outputted from the image pickup device.

BRIEF DESCRIPTION OF THE DRAWINGS

FIG. 11 is a diagram showing arrangement of pixel signals of the first memory unit and the second memory unit upon V2/2, H2/2 addition readout according to Embodiment 1;

DETAILED DESCRIPTION OF THE PREFERRED EMBODIMENTS

Embodiments of the present invention will be described below with reference to the drawings.

Embodiment 1

Figure 1:
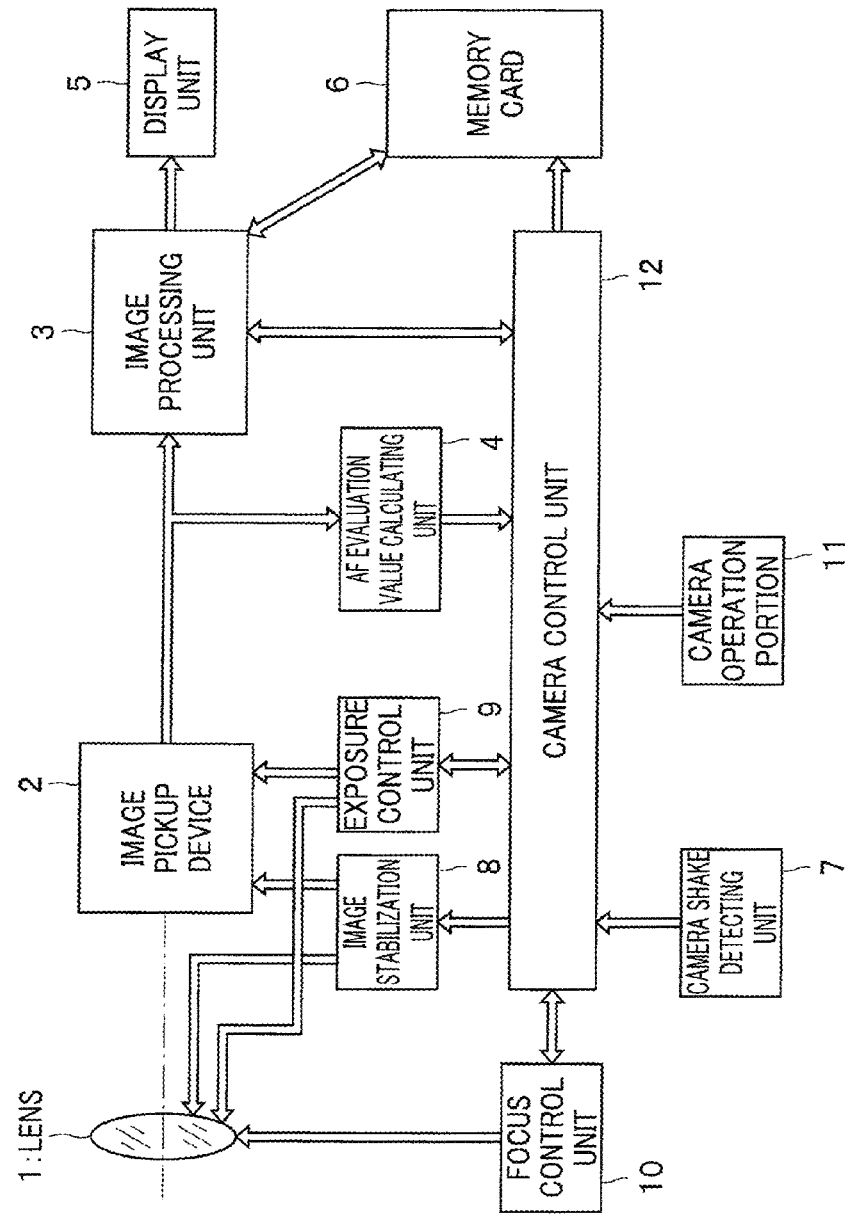
FIG. 1 is a block diagram showing a configuration of an image pickup apparatus according to Embodiment 1 of the present invention.

FIG. 1 to FIG. 13 show Embodiment 1 of the present invention, and FIG. 1 is a block diagram showing a configuration of an image pickup apparatus.

As shown in FIG. 1, the image pickup apparatus includes a lens 1, an image pickup device 2, an image processing unit 3, an AF (auto focus) evaluation value calculating unit 4, a display unit 5, a camera shake detecting unit 7, an image stabilization unit 8, an exposure control unit 9, a focus control unit 10, a camera operation unit 11 and a camera control unit 12. Note that while FIG. 1 also shows a memory card 6, because the memory card 6 is configured to be able to be attached to and removed from the image pickup apparatus, the memory card 6 does not have to be a component inherent in the image pickup apparatus.

The lens 1 is an image pickup optical system for forming an optical image of an object in an image pickup region of the image pickup device 2. The lens 1 includes a focus lens for performing focusing by adjusting a focus position (point of focus) and a diaphragm for controlling a range of a light flux passing through the lens, and further includes an image stabilization function in the present embodiment.

The image pickup device 2 performs photoelectric conversion on the optical image of the object formed by the lens 1 to output the image as an image signal. Note that, while, in the present embodiment, the image pickup device 2 is described as a color image pickup device (see FIG. 7) which has a primary color Bayer array color filter, the image pickup device 2 may, of course, employ other configurations. As will be described later with reference to FIG. 7, the image pickup device 2 of the present embodiment is configured such that pixels for focus detection are discretely arranged among pixels of a primary color Bayer array (pixels for image). Further, the image pickup device 2 is configured to be able to move in a plane perpendicular to a shooting optical axis of the lens 1 and includes an image stabilization function.

The image processing unit 3 performs various image processing on image signals outputted from pixels for image (specifically, for obtaining a movie or a still image) of the image pickup device 2, which will be described later. For example, when all the pixels are read out for a still image, the image processing unit 3 performs processing of performing interpolation calculation on pixel signals of the pixels for focus detection of the image pickup device 2, which will be described later, based on pixel signals of pixels for image near pixels for focus detection. Further, for example, when pixels are added and read out for a movie, and when pixel signals for focus detection are added in addition to pixel signals for image, the image processing unit 3 performs amplification corresponding to an amount of decrease of pixel signals due to opening of pixels of the pixels for focus detection being smaller than that of the pixels for image and performs interpolation corresponding to an amount of fluctuation of pixel signals due to pixels for focus detection located at a non-focusing position.

The AF evaluation value calculating unit 4 calculates an AF evaluation value based on the image signal outputted from the image pickup device 2 and outputs the AF evaluation value to the camera control unit 12. Specifically, the AF evaluation value calculating unit 4 calculates a phase difference based on signals read out from the pixels for focus detection of the image pickup device 2 and outputs the phase difference as the AF evaluation value. Note that, the AF evaluation value calculating unit 4 may further calculate a contrast value based on the image signal outputted from the image pickup device 2 and outputs the contrast value as the AF evaluation value (that is, the AF evaluation value calculating unit 4 may perform contrast AF in addition to phase difference AF).

The display unit 5 displays an image based on a signal subjected to image processing for display by the image processing unit 3. The display unit 5 performs live-view display, still image display, motion reproduction display, or the like, and also displays various information, or the like, relating to the image pickup apparatus.

The memory card 6 is a recording medium for storing a signal (such as a still image signal and a movie signal) subjected to image processing for recording by the image processing unit 3.

The camera shake detecting unit 7 which is configured to include an acceleration sensor, an angular velocity sensor, or the like, detects camera shake of the image pickup apparatus and outputs the result to the camera control unit 12.

The image stabilization unit 8 makes at least one of the lens 1 and the image pickup device 2 move so as to cancel out the detected camera shake based on control by the camera control unit 12 to reduce influence of camera shake on the optical object image formed in the image pickup region of the image pickup device 2.

The exposure control unit 9 controls a device shutter (which includes a global shutter and a rolling shutter) of the image pickup device 2 under control of the camera control unit 12 based on shutter speed (exposure period) determined by the camera control unit 12, and acquires an image. Further, the exposure control unit 9 controls a diaphragm, or the like, included in the lens 1 based on a diaphragm value determined by the camera control unit 12. Here, the shutter speed and the diaphragm value are determined by the camera control unit 12 using photometry data calculated based on the image signal outputted from the image pickup device 2, ISO speed set by the camera operation unit 11 (or automatically set by the camera control unit 12), or the like, based on, for example, a program chart, or the like, along an APEX system. Further, the exposure control unit 9 outputs drive information of the image pickup device 2 to the camera control unit 12.

The focus control unit 10 drives the lens 1 for adjusting focus. That is, the focus control unit 10 drives a focus lens included in the lens 1 based on control by the camera control unit 12 which receives the AF evaluation value from the AF evaluation value calculating unit 4 so that focus is adjusted on an object image to be formed on the image pickup device 2. In this manner, the AF evaluation value calculating unit 4, the camera control unit 12 and the focus control unit 10 configure a focus detection control unit which detects and controls a focus state based on signals read out from the pixels for focus detection of the image pickup device 2, and the image pickup apparatus of the present embodiment has a function as a focus detection apparatus. Further, the focus control unit 10 outputs lens drive information such as a lens position to the camera control unit 12.

The camera operation unit 11 is an operation unit for inputting various operation with respect to the image pickup apparatus. The camera operation unit 11 includes operating members such as a power switch for powering on/off the image pickup apparatus, a release button for inputting instruction such as still image shooting and movie shooting, and a mode button for setting a still image shooting mode, a movie shooting mode, a live-view mode, or the like.

The camera control unit 12 controls the whole of the image pickup apparatus including the image processing unit 3, the memory card 6, the image stabilization unit 8, the exposure control unit 9, the focus control unit 10, or the like, based on the lens drive information from the focus control unit 10, the AF evaluation value from the AF evaluation value calculating unit 4, drive information from the exposure control unit 9, processing information from the image processing unit 3, camera shake information from the camera shake detecting unit 7, operation input from the camera operation unit 11, or the like.

Figure 2:
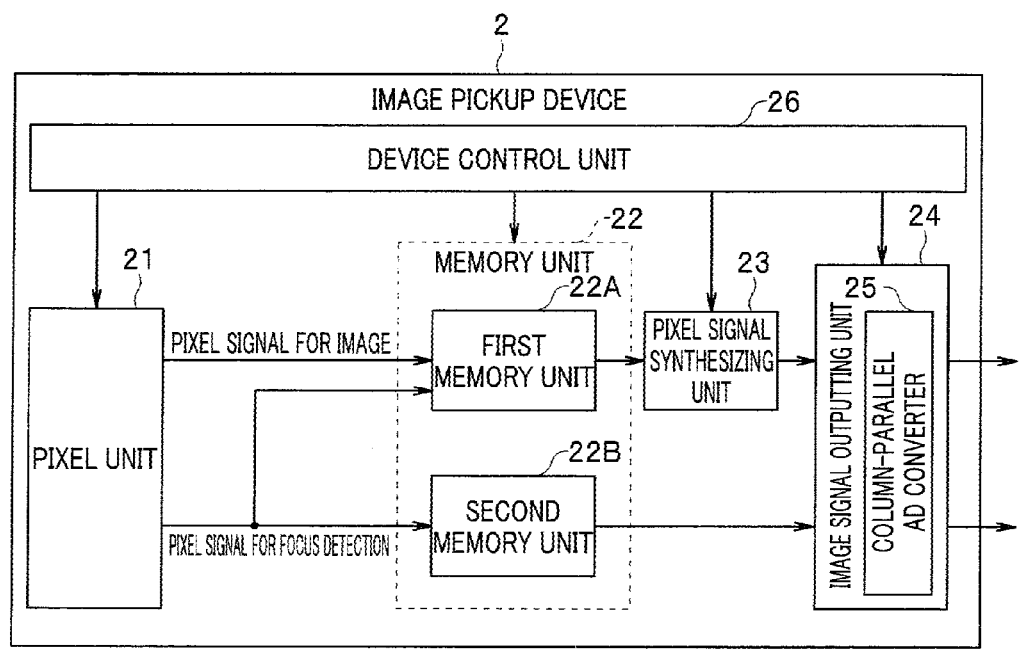
FIG. 2 is a block diagram showing outline of a configuration of an image pickup device according to Embodiment 1.

FIG. 2 is a block diagram showing outline of a configuration of the image pickup device 2.

The image pickup device 2 includes a pixel unit 21, a first memory unit 22A and a second memory unit 22B, a pixel signal synthesizing unit 23, an image signal outputting unit 24 and a device control unit 26.

The pixel unit 21 in which pixels 31 (see FIG. 3 to FIG. 5, or the like) which will be described later are arranged in a matrix, and, further, when a plurality of pixels 31 which are adjacent are regarded as unit pixels, the unit pixels are arranged in a matrix, generates pixel signals for image (as described above, for movie or for still image) and pixel signals for focus detection.

The first memory unit 22A is a first analog memory after which the pixel signal synthesizing unit 23 is disposed in the present embodiment, and which stores at least pixel signals for image read out from the pixel unit 21. Note that the first memory unit 22A is a first analog memory which is disposed after the pixel signal synthesizing unit 23 in Embodiments 2 and 3 which will be described later, and which stores synthesized pixel signals for image generated by the pixel signal synthesizing unit 23. The first memory unit 22A of the present embodiment further stores pixel signals for focus detection read out from the pixel unit 21.

The second memory unit 22B is a second analog memory which stores pixel signals for focus detection read out from the pixel unit 21.

Note that, while, in the present embodiment, part of the memory unit 22 is configured as the first memory unit 22A, and another part of the memory unit 22 is configured as the second memory unit 22B, the first memory unit 22A and the second memory unit 22B may be separately provided.

The pixel signal synthesizing unit 23 generates pixel signals for image obtained by synthesizing at least pixel signals for image generated from pixels within the unit pixels. Here, the pixel signal synthesizing unit 23 of the present embodiment generates pixel signals for image by further synthesizing pixel signals for focus detection in addition to pixel signals for image, and performs synthesis based on the pixel signals read out from the first memory unit 22A.

Because the pixel signal synthesizing unit 23 is disposed after the first memory unit 22A, the image signal outputting unit 24 outputs as image signals, the synthesized pixel signals for image generated by the pixel signal synthesizing unit 23 and pixel signals for focus detection stored in the second memory unit 22B.

The image signal outputting unit 24 has a column-parallel AD converter 25 in which ADC 33 which are AD converters (see FIG. 5, FIG. 10, or the like) are arranged in respective columns, and which reads out pixel signals in the respective columns simultaneously, and a group of pixel signals in which only the synthesized pixel signals for image are arranged and a group of pixel signals in which only the pixel signals for focus detection are arranged are arranged in series for each row configured with unit pixels, and subjected to AD conversion by the column-parallel AD converter 25.

The device control unit 26 controls readout of pixel signals from the pixel unit 21, readout of pixel signals from the memory unit 22, a pixel addition mode (such as a V2/2, H2/2 addition readout mode and a V1/5, H3/3 addition readout mode, which will be described later) by the pixel signal synthesizing unit 23, operation stop of an ADC from which a signal is not outputted among a plurality of ADCs (analog-digital converters) 33 (see FIG. 5 and FIG. 10) arranged in the column-parallel AD converter 25 of the image signal outputting unit 24, or the like.

Figure 3:
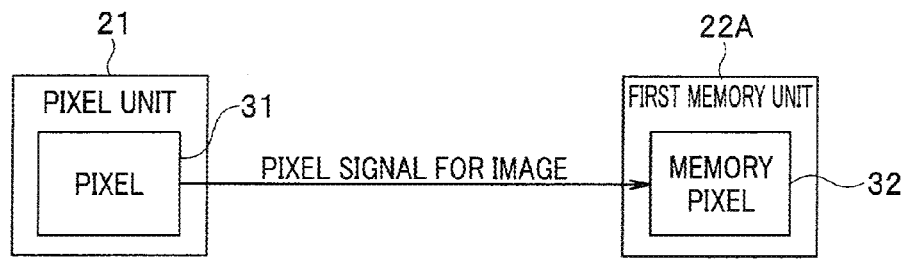
FIG. 3 is a block diagram showing a state where a pixel signal for image is transferred from a pixel of a pixel unit to a memory pixel of a first memory unit in Embodiment 1.

FIG. 3 is a block diagram showing a state where a pixel signal for image is transferred from a pixel 31 of the pixel unit 21 to a memory pixel 32 of the first memory unit 22A.

The pixels 31 for image in the pixel unit 21 are connected to the memory pixels 32 of the first memory unit 22A so as to, for example, one-to-one, correspond to the memory pixels 32, and a pixel signal for image read out from the pixel 31 for image is stored in the corresponding memory pixel 32.

Figure 4:
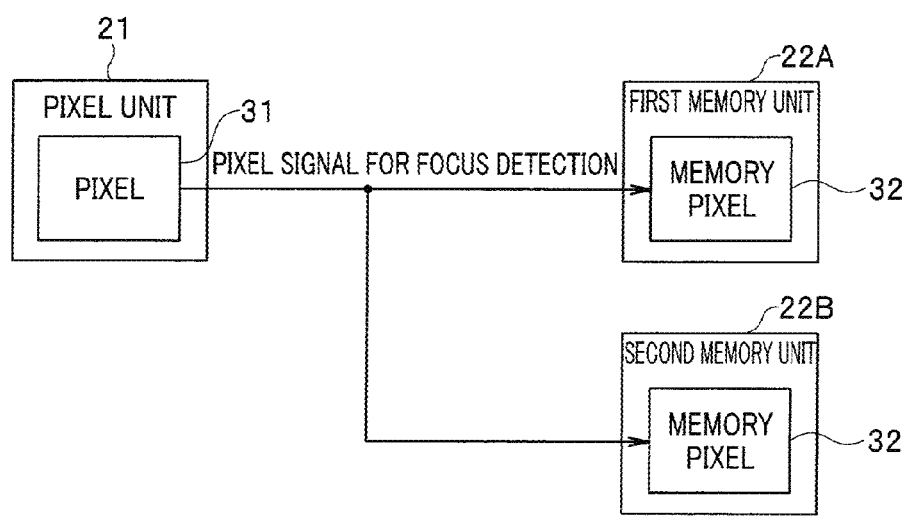
FIG. 4 is a block diagram showing a state where a pixel signal for focus detection is transferred from a pixel of a pixel unit to a memory pixel of a first memory unit and a second memory unit in Embodiment 1.

FIG. 4 is a block diagram showing a state where a pixel signal for focus detection is transferred from the pixel 31 of the pixel unit 21 to the memory pixels 32 of the first memory unit 22A and the second memory unit 22B.

The pixels 31 for focus detection in the pixel unit 21 are connected to the memory pixels 32 of the first memory unit 22A (although the memory pixels 32 are different from the memory pixels 32 in which the pixel signals for image are stored) and the memory pixels 32 of the second memory unit 22B, and pixel signals for focus detection read out from the pixels 31 for focus detection are respectively stored in the memory pixels 32 of the first memory unit 22A and the memory pixels 32 of the second memory unit 22B. That is, output of a given pixel 31 of focus for focus detection is transferred and stored in two locations of the memory pixel 32 of the first memory unit 22A and the memory pixel 32 of the second memory unit 22B.

Figure 5:
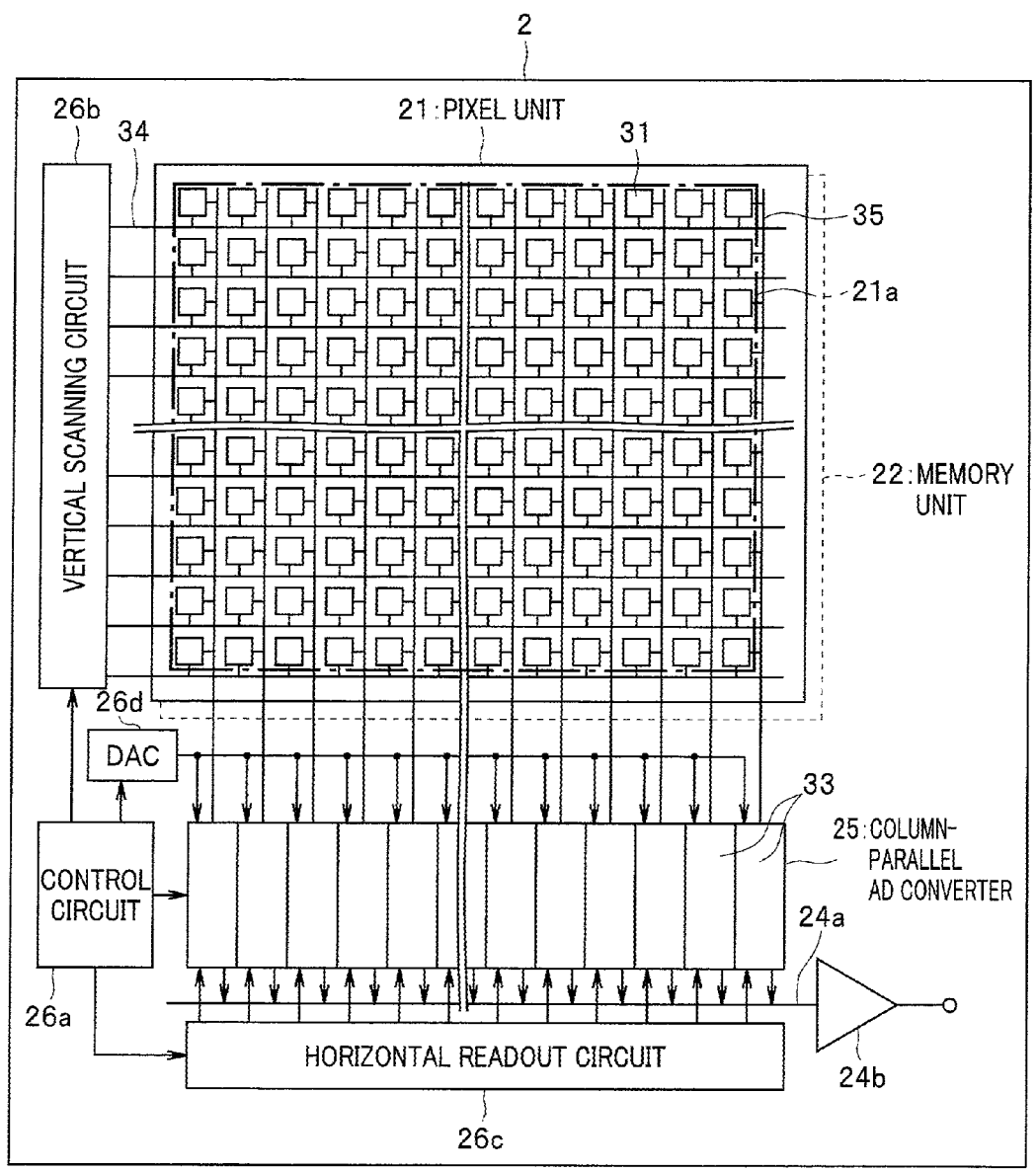
FIG. 5 is a diagram showing a more specific example of a configuration of the image pickup device according to Embodiment 1.

FIG. 5 is a diagram showing a more specific example of a configuration of the image pickup device 2. Note that arrangement of the respective circuit components shown in FIG. 5 is conceptualized as appropriate, and does not necessarily match actual arrangement.

Figure 7:
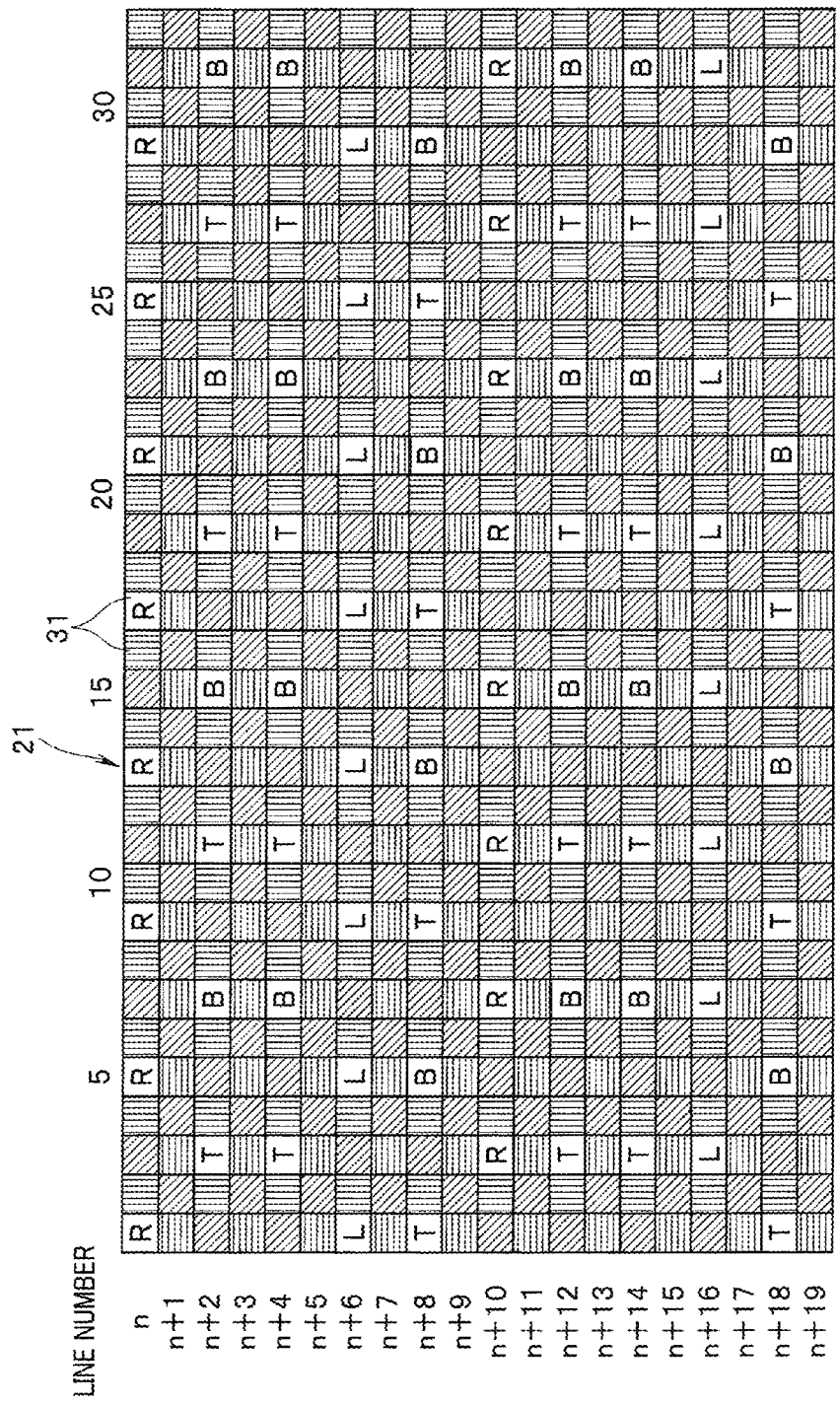
FIG. 7 is a diagram showing a configuration of the pixel unit according to Embodiment 1.

The pixel unit 21 is an image pickup region in which a plurality of pixels 31 for generating a signal charge according to an exposure amount are arranged in a matrix (see also FIG. 7). The arrangement in a row direction of the pixels 31 in the pixel unit 21 is referred to as a "row" or a "line", while the arrangement in a column direction is referred to as a "column". Further, the row direction is also referred to as a horizontal direction, while the column direction is also referred to as a vertical direction.

Note that while an AF region 21a from which pixel signals for focus detection are read out from the pixel unit 21 can be automatically or manually set in a desired region, in the example shown in FIG. 5, a wide region corresponding to the whole pixel unit 21 is set. Note that automatic setting of the AF region 21a is performed by the camera control unit 12 based on detection of an object, or the like, while manual setting of the AF region 21a is performed by a user through the camera operation unit 11. Therefore, the camera control unit 12 corresponds to a focus detection pixel region selecting unit for selecting the AF region 21a upon automatic setting, while the camera operation unit 11 corresponds to the focus detection pixel region selecting unit upon manual setting.

The memory unit 22 is a storage unit for temporarily accumulating signal charges of the respective pixels 31 arranged in the pixel unit 21. The memory unit 22 of the present embodiment is configured to include the first memory unit 22A having memory pixels 32 (see FIG. 8 to FIG. 10) of the same number and the same arrangement (the same number of rows and columns) as those of the pixels 31 for image and for focus detection arranged in the pixel unit 21, and the second memory unit 22B storing pixel signals of the pixels 31 for focus detection, for example. The memory unit 22 is, for example, configured by being laminated in a substrate thickness direction with respect to the pixel unit 21.

The above-described image signal outputting unit 24 further includes a horizontal signal line 24a and a sense amplifier circuit 24b in addition to the column-parallel AD converter 25.

The above-described device control unit 26 includes a control circuit 26a, a vertical scanning circuit 26b, a horizontal readout circuit 26c and a DAC (digital-analog converter) 26d.

The vertical scanning circuit 26b is configured with a shift resistor, or the like, and control signal lines 34 are connected to respective rows, so that control signals can be independently outputted to the pixel unit 21 and the memory unit 22 for each row. For example, when global shutter operation is performed, the vertical scanning circuit 26b starts exposure by stopping reset operation of all the pixels 31 of the pixel unit 21 simultaneously and stops exposure by transferring pixel signals of all the pixels 31 to the memory pixels 32 of the memory unit 22 simultaneously. Further, when rolling shutter operation is performed, the vertical scanning circuit 26b sequentially performs start of exposure by stopping reset operation of the pixels 31 and transfer of the pixel signals to the memory pixels 32 for each row. The vertical scanning circuit 26b controls readout of the memory pixels 32 arranged in the memory unit 22, for example, in a unit of row.

The vertical signal lines 35 are provided so as to respectively correspond to all the pixels 31 and columns of the memory pixels 32.

The column-parallel AD converter 25 includes a plurality of ADCs 33 respectively connected to a plurality of vertical signal lines 35. Because a plurality of (or all the) ADCs 33 can perform operation simultaneously, analog signals transferred via the plurality of (or all the) vertical signal lines 35 are converted into digital signals simultaneously. The column-parallel AD converter 25 performs signal processing such as noise removal and amplification on the pixel signals outputted for each column from the memory pixels 32 of the memory unit 22 via the vertical signal lines 35, and further performs processing of converting analog pixel signals into digital signals.

The DAC 26d converts digital signals to be outputted for controlling the column-parallel AD converter 25 by the control circuit 26a into analog signals.

The horizontal readout circuit 26c which is configured with, for example, a shift resistor, reads out pixel signals by sequentially selecting ADCs 33 of the column-parallel AD converter 25 corresponding to pixel columns from which pixel signals are to be read out, and by sequentially outputting the pixel signals from the column-parallel AD converter 25 to the horizontal signal lines 24a.

The sense amplifier circuit 24b performs signal processing such as amplification of the pixel signals outputted to the horizontal signal lines 24a.

The control circuit 26a is a control unit which generates a control signal such as a clock signal which is a reference of operation, a vertical synchronization signal VD (see FIG. 13, or the like), and a horizontal synchronization signal HD (see FIG. 13, or the like), based on control of the exposure control unit 9 and controls the above-described column-parallel AD converter 25, the vertical scanning circuit 26b, the horizontal readout circuit 26c, the DAC 26d, and the like. As will be described later with reference to FIG. 10, the control circuit 26a further controls on/off of bias currents of the vertical signal lines 35 of an image pickup readout circuit 40a and a focus detection readout circuit 40b via bias current control circuits 36a and 36b and on/off of counters 33b of the ADCs 33 via the counter control circuits 37a and 37b.

Figure 6:
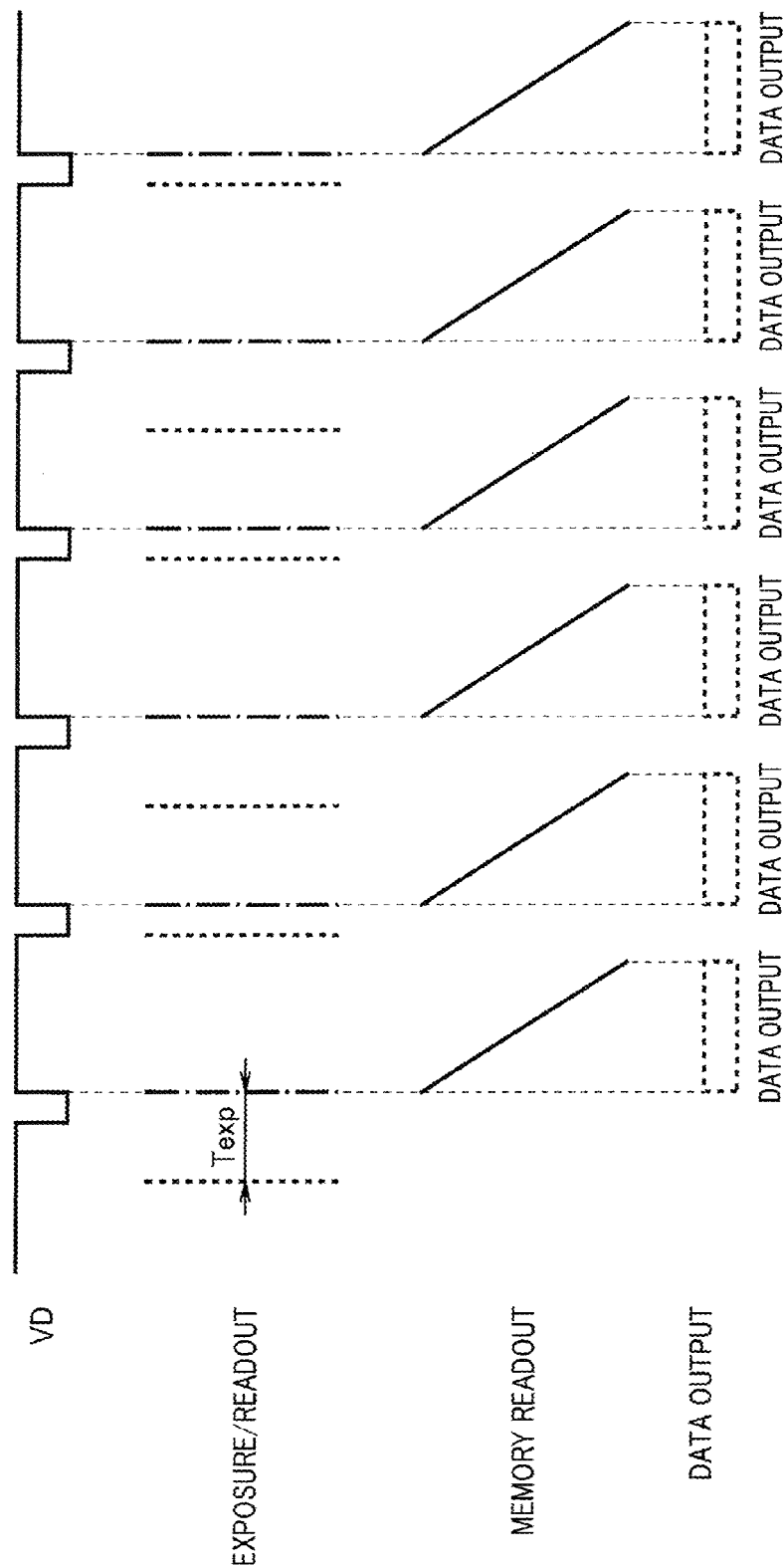
FIG. 6 is a timing chart showing each signal when basic global shutter image pickup operation is performed in the image pickup device according to Embodiment 1.

Next, FIG. 6 is a timing chart showing each signal when basic global shutter image pickup operation is performed in the image pickup device 2.

First, the camera control unit 12 sets an exposure period Texp based on a photometry result.

The exposure control unit 9 finishes reset operation of photoelectric converting units (photo diodes) of all the pixels of the image pickup device 2 performed in advance at a time point dating back from a rising timing of a vertical synchronization signal VD by, for example, the exposure period Texp, simultaneously. From a time point when the reset operation is finished, exposure is started, and signal charges are accumulated in the photoelectric converting unit. Signal charges are accumulated by the photoelectric converting unit until the exposure period Texp elapses.

Next, at a rising timing of the vertical synchronization signal VD after the exposure period Texp has elapsed, pixel signals accumulated in all the pixels are transferred to the memory pixels 32 of the memory unit 22 simultaneously. By this means, exposure of the all the pixels are collectively finished (simultaneously).

Subsequently, the pixel signals are sequentially read out from the memory unit 22 to the horizontal signal lines 24a for each row while pixel signals of a plurality of columns are subjected to AD conversion simultaneously by the column-parallel AD converter 25, and amplified by the sense amplifier circuit 24b and outputted.

In this manner, while transfer of the pixel signals from the pixel unit 21 to the memory unit 22 is finished for an extremely short period of time because the transfer is performed simultaneously, because AD conversion is sequentially performed for each row by the column-parallel AD converter 25 (because AD conversion itself requires time for counting a clock as will be described later), it takes time according to the number of times of execution of AD conversion. In this way, broadly speaking, time required for reading out an image, and, eventually, a frame rate of a movie increase in proportion to the number of times of operation of the column-parallel AD converter 25.

FIG. 7 is a diagram showing a configuration of the pixel unit 21.

Pixels for focus detection in the pixel unit 21 are arranged as shown in FIG. 7 as an example.

In the pixels 31 arranged in the pixel unit 21, pixels for image for picking up an image of an object image and pixels for focus detection for performing focus detection based on a phase difference are provided. A group of pixels for image is a plurality of pixels arranged in a row direction and in a column direction, and a group of pixels for focus detection is discretely arranged among the group of pixels for image.

Examples of the pixels for focus detection in the present invention include pixels R for focus detection for performing photoelectric conversion on light beam passing through a right side of a pupil of the lens 1, pixels L for focus detection for performing photoelectric conversion on light beam passing through a left side, pixels T for focus detection for performing photoelectric conversion on light beam passing through an upper side, and pixels B for focus detection for performing photoelectric conversion on light beam passing through a lower side.

Among these pixels, a phase difference in a horizontal direction (row direction) is detected based on an image obtained with the pixels R for focus detection and an image obtained with the pixels L for focus detection, while a phase difference in a vertical direction (column direction) is detected based on an image obtained with the pixels T for focus detection and an image obtained with the pixels B for focus detection.

Note that pixels for detecting a phase difference are not limited to these, and it is also possible to provide pixels for focus detection for detecting a phase difference in a right oblique direction, in a left oblique direction or in other directions. In this manner, focus detection performance is improved by making it possible to also detect phase differences in directions other than the horizontal direction in addition to a phase difference in the horizontal direction.

A plurality of the pixels R, L, T and B for focus detection are discretely arranged among the plurality of pixels 31 arranged in a matrix within the pixel unit 21 as described above.

Specifically, the pixels for focus detection are arranged by basic arrangement patterns as shown in, for example, FIG. 7 being spread within the pixel unit 21. Note that, in FIG. 7, diagonal hatching from upper left to lower right indicates green pixels in the pixels for image, vertical hatching indicates red pixels in the pixels for image, and horizontal hatching indicates blue pixels in the pixels for image.

In the basic arrangement patterns shown in FIG. 7, the pixels R, L, T and B for focus detection are arranged only at positions of the green pixels in the primary color Bayer array, and, particularly, in the example shown in FIG. 7, arranged only at positions of green pixels which are located in the same row as that of the red pixels and in the same column as that of the blue pixels. Lines in which any of the pixels R, L, T and B for focus detection is arranged one in every four pixels, and lines in which none of the pixels R, L, T and B for focus detection is arranged alternately exist.

Specifically, if only lines in which any of the pixels R, L, T and B for focus detection are arranged is described in order of line numbers, the lines include a line n in which only pixels R for focus detection are arranged, a line (n+2) in which pixels T and B for focus detection are alternately arranged while being shifted in a horizontal direction by two pixels from the line n, a line (n+4) having the same arrangement in the horizontal direction as that of the line (n+2), a line (n+6) having the same arrangement in the horizontal direction as the line n and only pixels L for focus detection are arranged, a line (n+8) in which pixels T and B for focus detection are alternately arranged while being shifted in a horizontal direction by −2 pixels from the line (n+2), a line (n+10) in which only pixels R for focus detection are arranged while being shifted in a horizontal direction by two pixels from the line n, a line (n+12) and a line (n+14) having the same arrangement in the horizontal direction as the line (n+2), a line (n+16) having the same arrangement in the horizontal direction as the line (n+10) and in which only pixels L for focus detection are arranged, a line (n+18) having the same arrangement in the horizontal direction as the line (n+8), or the like.

In this manner, in the example shown in FIG. 7, because the pixels R, L, T and B for focus detection are arranged one in every two lines and one in every four pixels in a horizontal direction, the pixels R, L, T and B for focus detection account for ⅛ of all the pixels. Therefore, for example, 80 pixels which is ⅛ of 640 pixels comprised of 20 rows and 32 columns as shown in FIG. 7 are the pixels R, L, T and B for focus detection.

Figure 8:
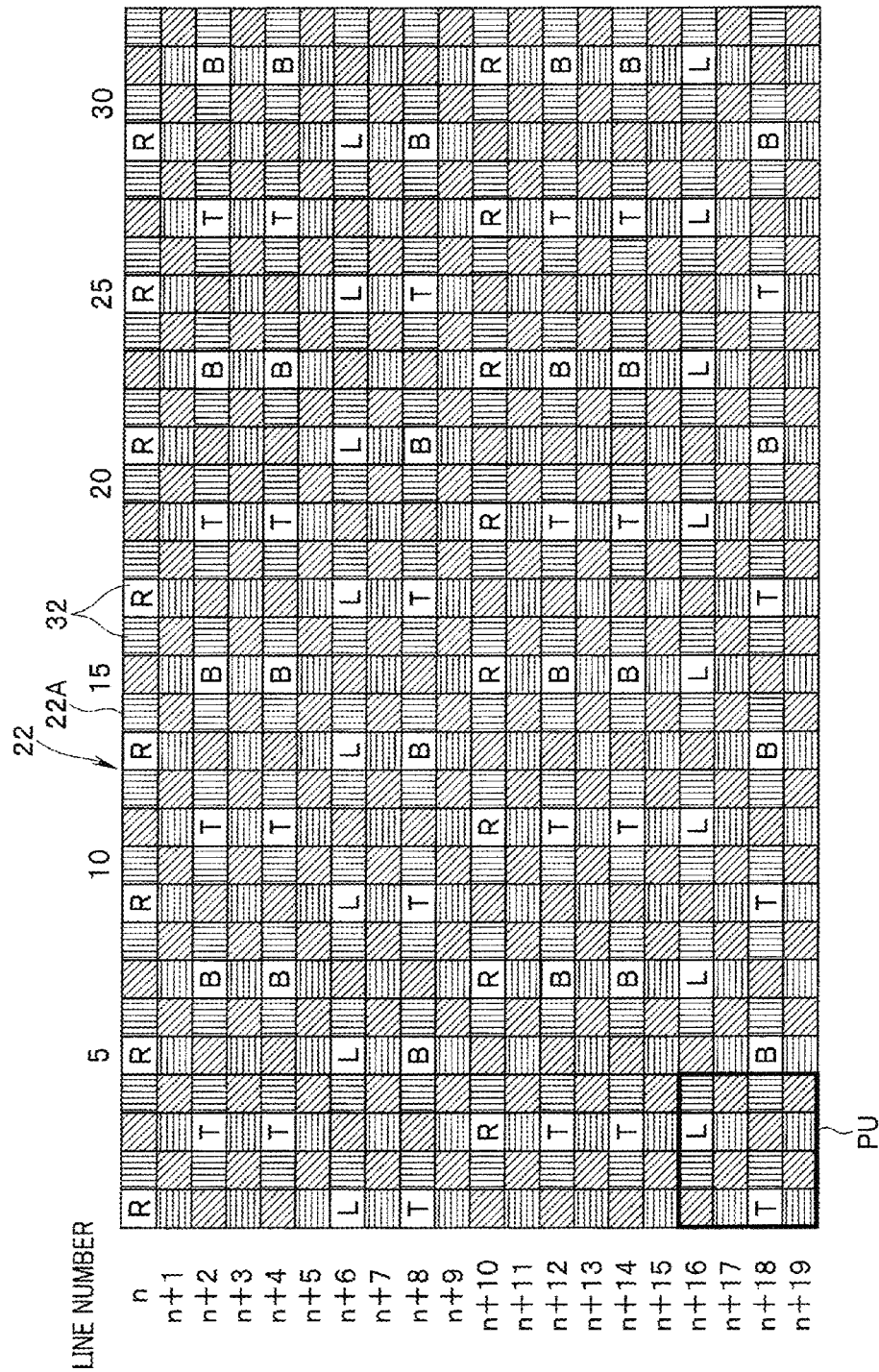
FIG. 8 is a diagram showing arrangement of pixel signals stored in the first memory unit and an example of a unit pixel PU upon V2/2, H2/2 addition readout according to Embodiment 1.

FIG. 8 is a diagram showing arrangement of the pixel signals stored in the first memory unit 22A and an example of the unit pixel PU upon V2/2, H2/2 addition readout.

First, the arrangement of pixel signals to be transferred to the first memory unit 22A shown in FIG. 8 is the same as the arrangement of the pixels in the pixel unit 21 shown in FIG. 7.

Further, the V2/2, H2/2 addition readout means the following addition readout. First, V is a vertical direction of the arrangement of the pixel signals, and H is a horizontal direction of the arrangement of the pixel signals. Still further, in a fraction added to V or H, a denominator indicates for each of how many pixels of the same color in an array the pixels are added, and a numerator indicates the number of pixels to be added. Therefore, V2/2 indicates that two pixels are added for each of two pixels of the same color in the vertical direction, and H2/2 indicates that two pixels are added for each of two pixels of the same color in the horizontal direction.

Therefore, from the unit pixel PU comprised of 4×4 pixels shown in FIG. 8, synthesized green pixels (upper left) obtained by adding two green pixels and the pixel L for focus detection and the pixel T for focus detection, a synthesized red pixels (upper right) obtained by adding four red pixels, synthesized blue pixels (lower left) obtained by adding four blue pixels, and synthesized green pixels (lower right) obtained by adding four green pixels are generated.

Figure 9:
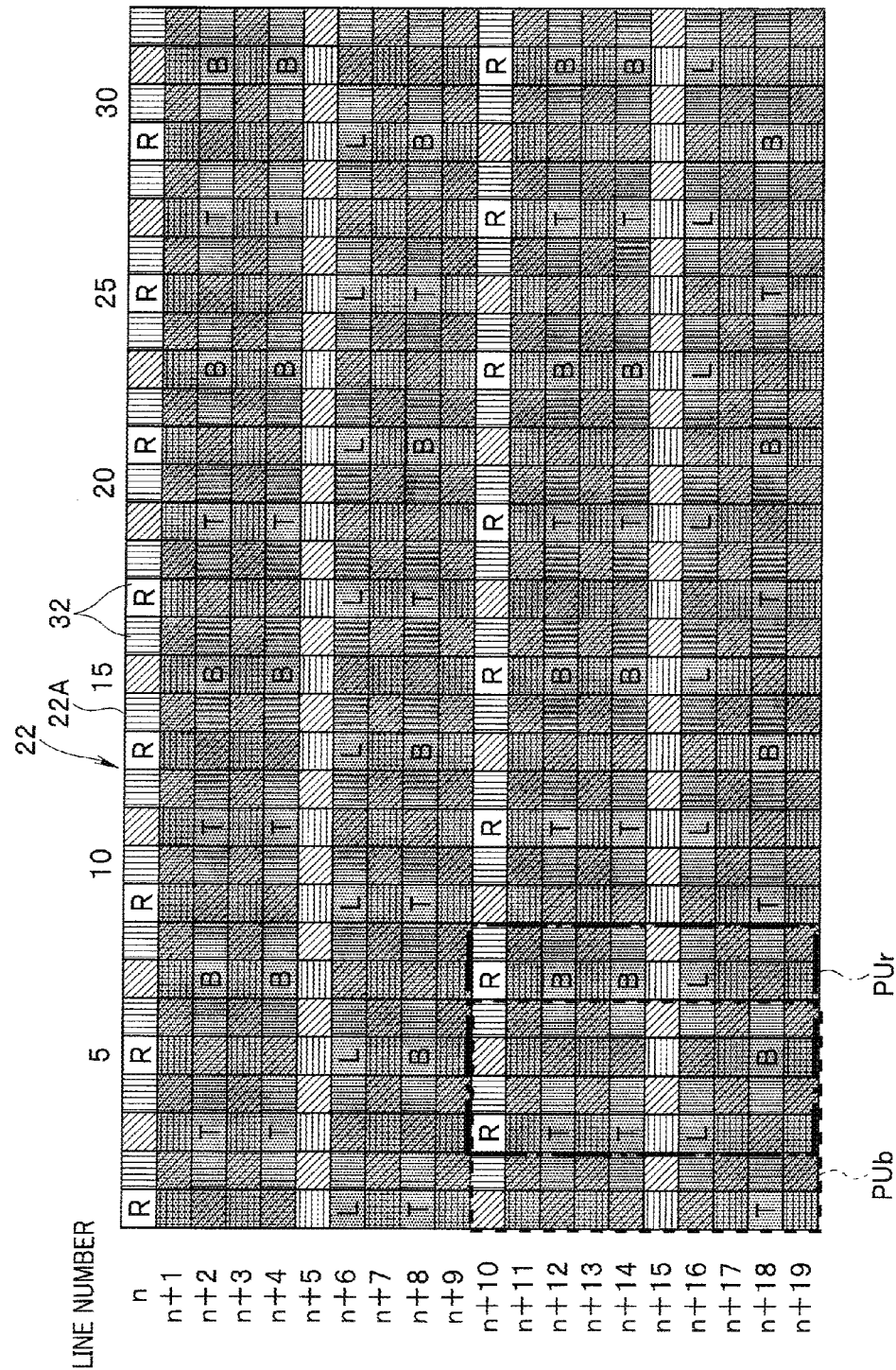
FIG. 9 is a diagram showing arrangement of the pixel signals stored in the first memory unit and an example of unit pixels PUb, PUr upon V1/5, H3/3 addition readout according to Embodiment 1.

Next, FIG. 9 is a diagram showing arrangement of the pixel signals stored in the first memory unit 22A and examples of unit pixels PUb and PUr upon V1/5, H3/3 addition readout.

The V1/5, H3/3 addition readout means that one pixel is read out for each of five pixels of the same color in the vertical direction (that is, interpolation readout is performed without addition in the vertical direction being performed), and that three pixels are added for each of three pixels of the same color in the horizontal direction.

Therefore, from the unit pixel PUb comprised of 6×10 pixels relating to green and blue shown in FIG. 9, synthesized green pixels (upper left) obtained by adding two green pixels in the line (n+10) and the pixel R for focus detection, and synthesized blue pixels (lower left) obtained by adding three blue pixels in the line (n+15), are generated.

Further, from the unit pixel PUr comprised of 6×10 pixels relating to green and red shown in FIG. 9, synthesized red pixels (upper right) obtained by adding three red pixels in the line (n+10) and synthesized green pixels (lower right) obtained by adding three green pixels in the line (n+15), are generated.

In this manner, in the V1/5, H3/3 addition readout, there are lines (n+1) to (n+4), (n+6) to (n+9), (n+11) to (n+14) and (n+16) to (n+19) from which pixel signals are not read out. Therefore, when ⅕ interpolation readout is performed in the vertical direction, even if addition is not performed in the horizontal direction, because pixel signals of the pixels L, T and B for focus detection are not read out from the first memory unit 22A, phase difference AF cannot be performed only through readout from the first memory unit 22A.

In this manner, in the present embodiment, the pixels R, L, T and B for focus detection are stored in the second memory unit 22B separately and read out, so that phase difference AF can be performed also in addition readout accompanied by interpolation.

Figure 10:
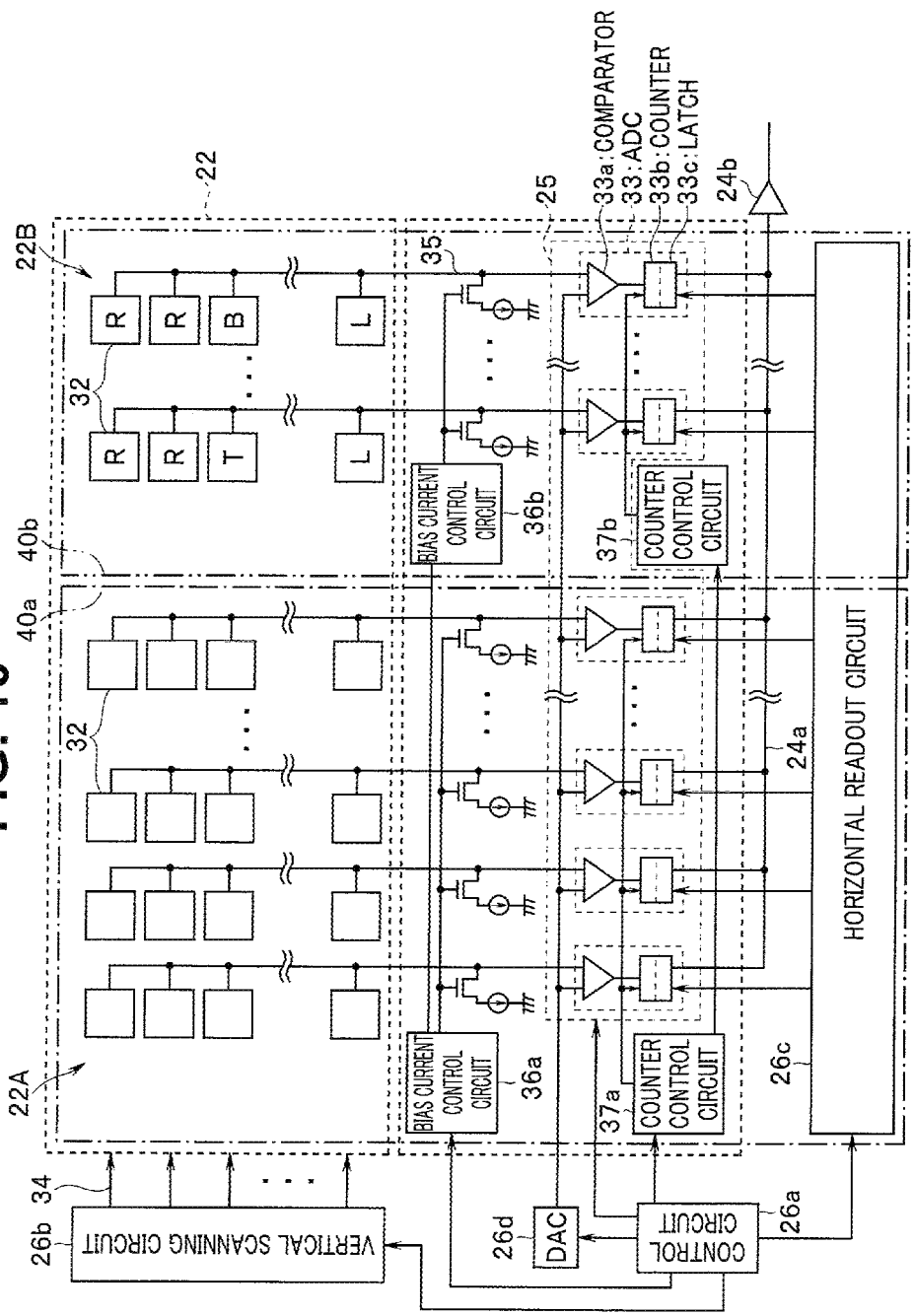
FIG. 10 is a diagram showing details of configurations of the first memory unit, the second memory unit and a column-parallel AD converter in the image pickup device according to Embodiment 1.

Next, FIG. 10 is a diagram showing detailed configuration of the first memory unit 22A, the second memory unit 22B and the column-parallel AD converter 25 in the image pickup device 2.

An ADC 33 provided so as to correspond to each column in the column-parallel AD converter 25 includes a comparator 33a, a counter 33b and a latch 33c.

The above-described DAC 26d outputs a reference voltage to the comparator 33a based on a control signal from the control circuit 26a. Here, the reference voltage outputted by the DAC 26d is a voltage having a ramp waveform which changes in a slope shape.

When the comparator 33a receives input of an analog pixel signal from the vertical signal line 35, the comparator 33a compares a voltage of the inputted pixel signal with the reference voltage. The comparator 33a inverts an output signal when magnitude relationship between the voltage of the pixel signal and the reference voltage is inverted. Here, the comparator 33a which has a configuration of a typical differential amplifier comprised of, for example, a plurality of PMOS transistors and a plurality of NMOS transistors, consumes power upon operation. Capacitors for storing a reset level (reset noise), which are not shown, are respectively connected to a portion of the comparator 33a to which a signal line from the DAC 26d is connected and a portion to which the vertical signal line 35 is connected. These capacitors are reset by an instruction signal from the control circuit 26a.

The counter 33b digitally counts a period until the output signal from the comparator 33a is inverted, that is, a period (comparison period) until the magnitude relationship between the reference voltage of the ramp waveform and the voltage of the pixel signal is inverted as, for example, the number of inputted clocks.

The latch 33c functions as a digital memory which holds a count result by the counter 33b, and is connected to the sense amplifier circuit 24b via the horizontal signal line 24a. Further, the latch 33c is connected to the horizontal readout circuit 26c, and, if the latch 33c is selected and a control signal is inputted by the horizontal readout circuit 26c, outputs the held digital signal.

In such a configuration, a bias current control circuit 36a and a counter control circuit 37a are provided at an image pickup readout circuit 40a, and a bias current control circuit 36b and a counter control circuit 37b are provided at the focus detection readout circuit 40b.

The bias current control circuit 36a controls on/off of a bias current of each vertical signal line 35 in the image pickup readout circuit 40a based on control by the control circuit 26a in order to source-follower output only a signal transferred to the memory pixel 32 of the pixel in the group of pixels for image.

In a similar manner, the bias current control circuit 36b controls on/off of a bias current of each vertical signal line 35 within the focus detection readout circuit 40b based on control by the control circuit 26a in order to source-follower output only a signal transferred to the memory pixel 32 of the pixel in the group of pixels for focus detection.

Note that, although detailed illustration is omitted here, the bias current control circuits 36a and 36b are configured to be able to control on/off of a bias current of an arbitrary vertical signal line 35 as desired. Therefore, as an example, the bias current control circuits 36a and 36b can control to turn on bias currents of vertical signal lines 35 of even number columns while turning off bias currents of vertical signal lines 35 of odd number columns, or the like.

Further, the counter control circuit 37a controls on/off of each counter 33b within the image pickup readout circuit 40a based on control by the control circuit 26a.

In a similar manner, the counter control circuit 37b controls on/off of each counter 33b within the focus detection readout circuit 40b based on control by the control circuit 26a.

The counter control circuits 37a and 37b are configured to be able to control on/off of the counter 33b relating to an arbitrary vertical signal line 35 as desired. Therefore, as with the example described above, the counter control circuits 37a and 37b can control to turn on counters 33b of even number columns, while turning off counters 33b of odd number columns, or the like.

Here, a constant current circuit unit configuring a source-follower circuit and a single slope type column parallel ADC (column parallel ADC) are circuits units which consume large power in the image pickup device 2 of the present embodiment.

Therefore, with the configuration as described above, the bias current of a vertical signal line 35 which is not used for AD conversion is turned off and operation of the ADC 33 is stopped, so that readout is performed at as high speed as possible and with as low power consumption as possible.

Figure 11:
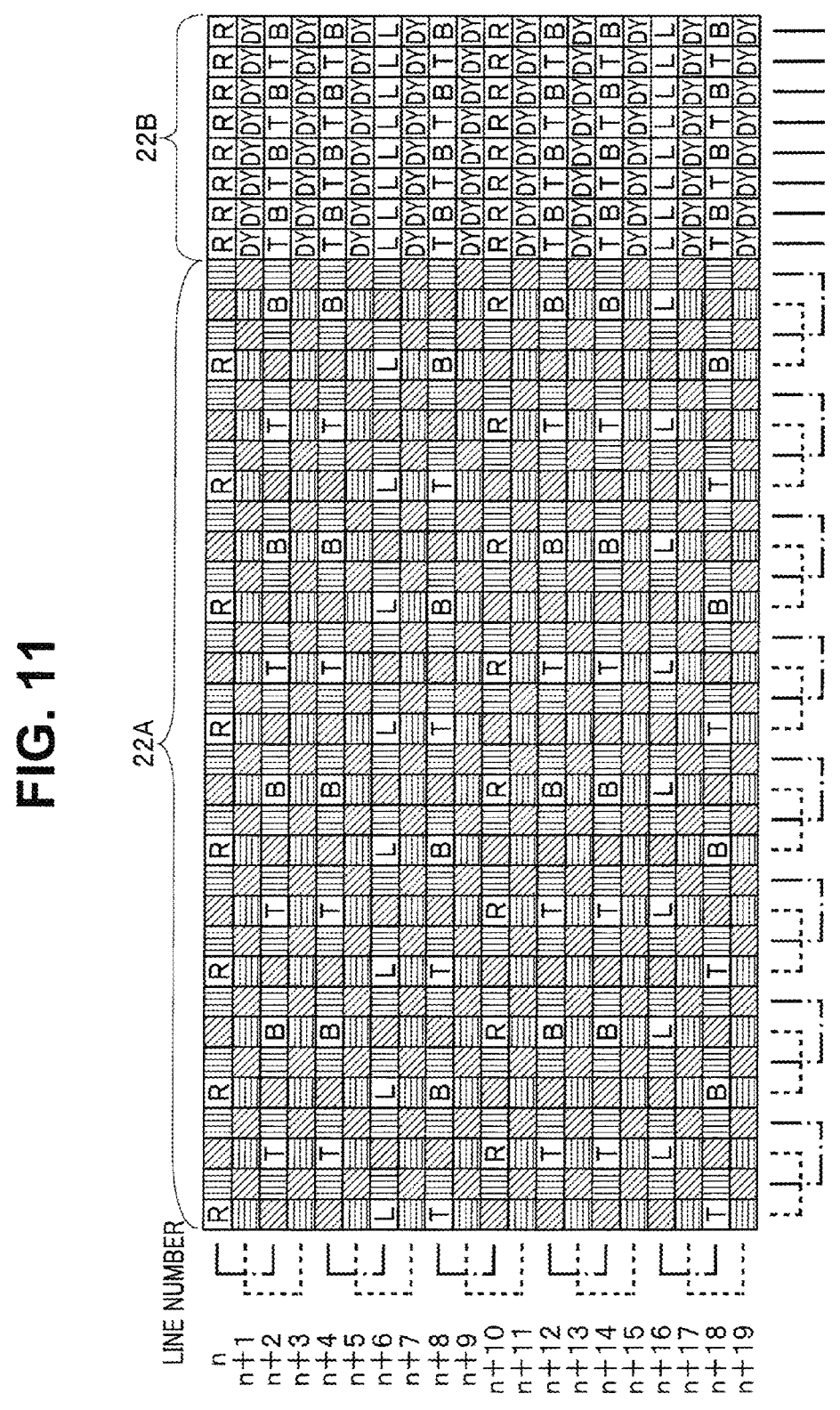

FIG. 11 is a diagram showing arrangement of pixel signals of the first memory unit 22A and the second memory unit 22B upon V2/2, H2/2 addition readout.

Upon the V2/2, H2/2 addition readout, because the pixel signal synthesizing unit 23 adds two pixels of the pixel signals read out from the first memory unit 22A in the vertical direction, the number of lines in which AD conversion is performed by the column-parallel AD converter 25 is reduced to ½, so that it is possible to double a frame rate in the case of readout of all the pixels.

Therefore, in order to maintain this frame rate, the pixel signals for focus detection are stored in the second memory unit 22B one in every two lines, and output is not performed from a line of dummy data DY to the column-parallel AD converter 25.

Specifically, because the pixels for focus detection exist one in every two lines, the pixel signals for focus detection are arranged in the second memory unit 22B on the same lines as the lines where the pixels for focus detection exist in the pixel unit 21.

In this manner, by arranging in series the group of pixel signals in which only the pixel signals for image synthesized through vertical 2 pixel addition are arrayed and the group of pixel signals in which only the pixel signals for focus detection are arrayed for each row comprised of unit pixels PU, and performing AD conversion by the column-parallel AD converter 25 simultaneously, it is possible to increase the frame rate.

Further, upon V2/2, H2/2 addition readout, because two pixels of the pixel signals read out from the first memory unit 22A are added also in the horizontal direction, it is sufficient for the ADC 33 to perform operation one in every two columns. Therefore, the bias current control circuit 36a turns off bias currents of the vertical signal lines 35 one in every two columns, and the counter control circuit 37a turns off the counter 33b, so as to reduce power consumption. Further, although not explicitly described, the bias current control circuit 36b and the counter control circuit 37b turn off a bias current of a vertical signal line 35 corresponding to a column from which the pixel signals for focus detection are not read out and turn off the counter 33b, so as to further reduce power consumption.

Figure 12:
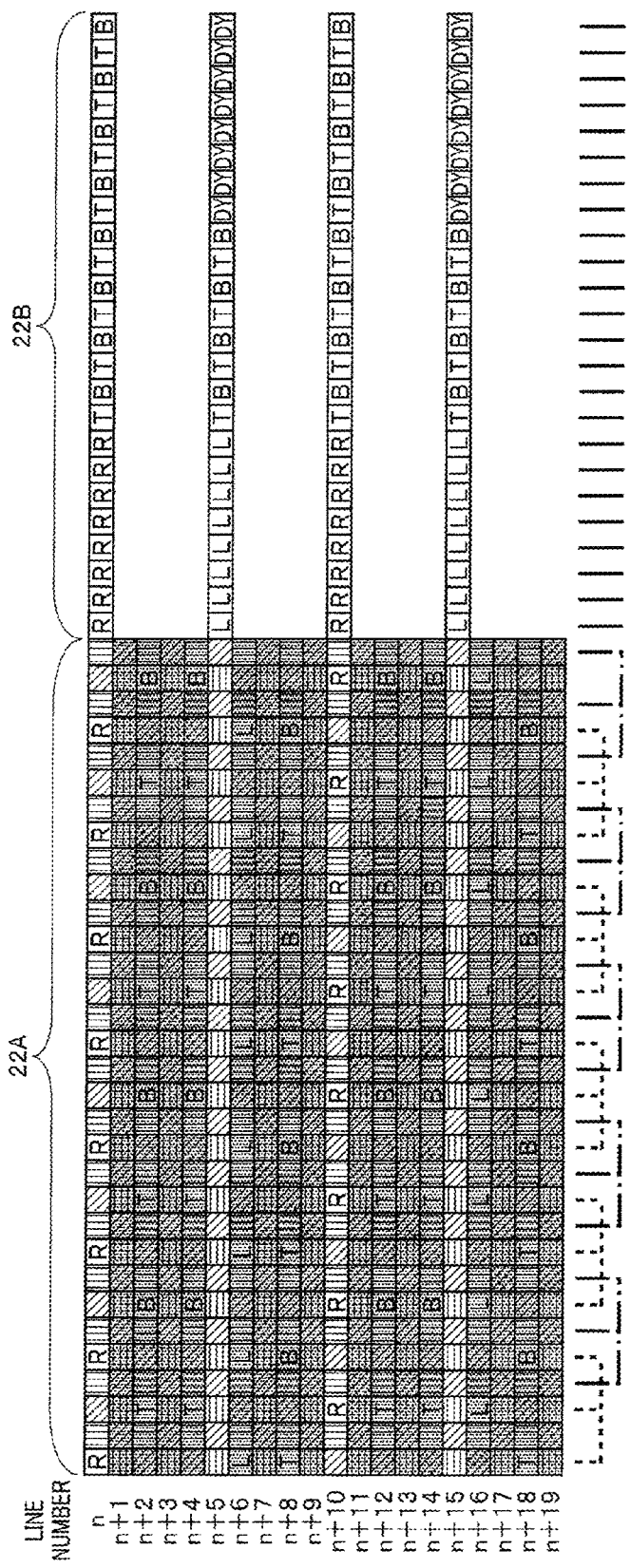
FIG. 12 is a diagram showing arrangement of pixel signals of the first memory unit and the second memory unit upon V1/5, H3/3 addition readout according to Embodiment 1.

FIG. 12 is a diagram showing arrangement of the pixel signals of the first memory unit 22A and the second memory unit 22B upon V1/5, H3/3 addition readout. Note that, in FIG. 12, a line for only dummy data DY in the second memory unit 22B is not shown.

Upon V1/5, H3/3 addition readout, because the pixel signals read out from the first memory unit 22A are interpolated to ⅕ in the vertical direction by the pixel signal synthesizing unit 23, the number of lines in which AD conversion is performed by the column-parallel AD converter 25 is reduced to ⅕, so that it is possible to make a frame rate approximately five times as that in the case of readout of all the pixels.

Therefore, in order to maintain the frame rate, the pixel signals for focus detection in one in every five lines are stored in the second memory unit 22B (therefore, the number of columns of the memory pixel 32 in which the pixel signals for focus detection are stored becomes, for example, 5/2 times as that upon the V2/2, H2/2 addition readout shown in FIG. 11 (however, in the example shown in FIG.

12, because dummy data DY exists also in a line for which readout is to be performed, the number of columns becomes 5/2 times or larger)). Output is not performed to the column-parallel AD converter 25 from the line of only dummy data DY in the second memory unit 22B which is not shown.

Specifically, if the pixel arrangement shown in FIG. 7 is divided for each of five lines, arrangement including three lines where the pixels for focus detection exist and arrangement including two lines where the pixels for focus detection exist alternately appear. Therefore, when there are three lines where the pixels for focus detection exist in the five lines, all the pixels for focus detection in these three lines are arranged in lines for which readout is to be performed (in the example shown in FIG. 12, the lines n and (n+10)), while when there are two lines where the pixels for focus detection exist in the five lines, all the pixels for focus detection in these two lines are arranged in lines for which readout is to be performed (in the example shown in FIG. 12, the lines (n+5), (n+15)), and dummy data DY is arranged in the memory pixel 32 which is left.

In this manner, by arranging in series the group of pixel signals in which only the pixel signals for image synthesized through vertical 1/5 interpolation are arrayed and the group of pixel signals in which only the pixel signals for focus detection are arrayed for each row comprised of the unit pixels PUr and PUb and performing AD conversion by the column-parallel AD converter 25 simultaneously, it is possible to increase a frame rate.

Further, upon V1/5, H3/3 addition readout, because three pixels of the pixel signals read out from the first memory unit 22A are added also in the horizontal direction, it is sufficient for the ADC 33 to perform operation one in every three columns. Therefore, the bias current control circuit 36a turns off bias currents of the vertical signal line 35 one in every three columns and the counter control circuit 37a turns off the counter 33b, so as to reduce power consumption. Further, although not explicitly described, the bias current control circuit 36b and the counter control circuit 37b turn off a bias current of a vertical signal line 35 corresponding to a column from which the pixel signals for focus detection are not read out and turn off the counter 33b, so as to further reduce power consumption.

Figure 13:
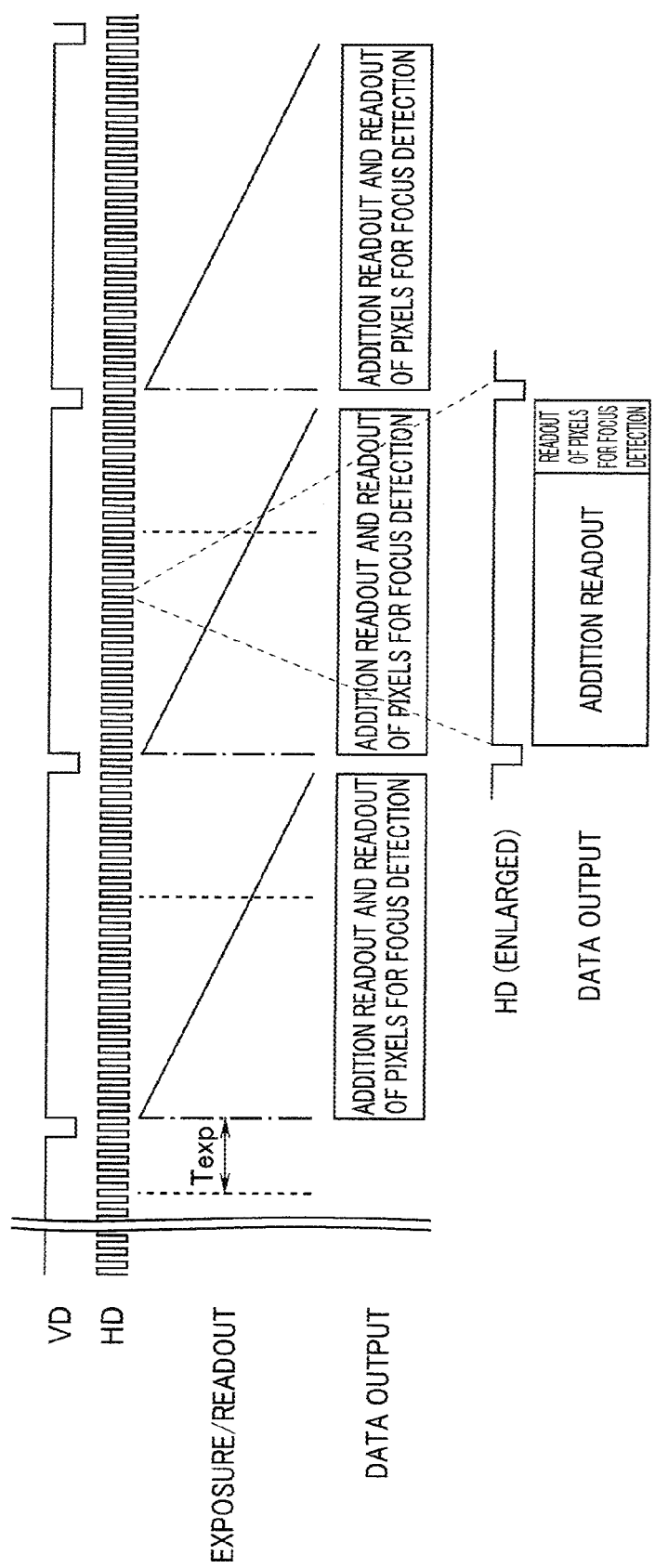
FIG. 13 is a timing chart including a partial enlarged view, showing each signal when global shutter image pickup operation is performed in the image pickup device according to Embodiment 1.

FIG. 13 is a timing chart including a partial enlarged view, showing each signal when global shutter image pickup operation is performed in the image pickup device 2.

The exposure operation in the pixel unit 21, the operation of transferring from the pixel unit 21 to the memory unit 22, operation of sequentially performing readout from the memory unit 22 and performing AD conversion by the column-parallel AD converter 25, or the like, are the same as described above with reference to FIG. 6. As shown in the enlarged view of 1HD in FIG. 13, upon readout of one line, first, synthesized pixel signals for image are read out, and, then, pixel signals for focus detection are read out.

Further, a technique for increasing a frame rate by reducing the number of times of operation of the column-parallel AD converter 25 by addition readout or interpolation readout as described above is applied not only upon the global shutter image pickup operation as shown in FIG. 6 and FIG. 13, but also can be applied upon rolling shutter image pickup operation. Specifically, at the time point dating back from a rising timing of the vertical synchronization signal VD by the exposure period Texp, exposure is sequentially started from, for example, an upper end line to a lower end line. Pixel signals are read out sequentially from a line for which the exposure period Texp has elapsed, and pixel addition, or the like, is performed at the pixel signal synthesizing unit 23, and pixel signals of a plurality of columns are AD converted simultaneously by the column-parallel AD converter 25 and outputted. At this time, in readout of one line, first, synthesized pixel signals for image are read out, and, then pixel signals for focus detection are read out as with the case shown in the partial enlarged view of 1HD in FIG. 13.

According to Embodiment 1, because pixel signals for image synthesized from pixels 31 within the unit pixel by the pixel signal synthesizing unit 23 and pixel signals for focus detection stored in the second memory unit 22B are outputted as image signals, it is possible to perform focus detection by reading out the pixel signals for focus detection while effectively reducing a period for reading out the image.

Further, because the image signal outputting unit 24 arranges in series the group of pixel signals in which only the synthesized pixel signals for image are arrayed and the group of pixel signals in which only the pixel signals for focus detection are arrayed, and the column-parallel AD converter 25 performs AD conversion, the number of times of AD conversion becomes the same as the number of lines of the synthesized pixel signals for image and is not increased, so that it is possible to effectively improve a frame rate without increasing a period required for AD conversion.

Further, because the image signal outputting unit 24 stops operation of an AD converter 25 which is not used for AD conversion based on control by the device control unit 26, it is possible to effectively reduce power consumption of the image pickup device 2. At this time, further, because the bias current control circuit 36a turns off a bias current of a vertical signal line 35 which is not used for AD conversion, it is possible to further reduce power consumption.

Further, because the pixel signal synthesizing unit 23 generates pixel signals for image by synthesizing pixel signals for focus detection generated from pixels 31 within the unit pixel in addition to the pixel signals for image generated from pixels 31 within the unit pixel, it is possible to improve the total image quality, for example, reduce moire, by increasing space sampling information and with a correction technique through appropriate image processing.

In addition, it is possible to provide the above-described advantages to the pixel unit 21 in which the pixels 31 for generating pixel signals for image and pixels 31 for generating pixel signals for focus detection are arranged in a matrix.

Further, in the image pickup apparatus provided with the above-described image pickup device, it is possible to perform phase difference AF while maintaining a high frame rate.

Embodiment 2

Figure 14:
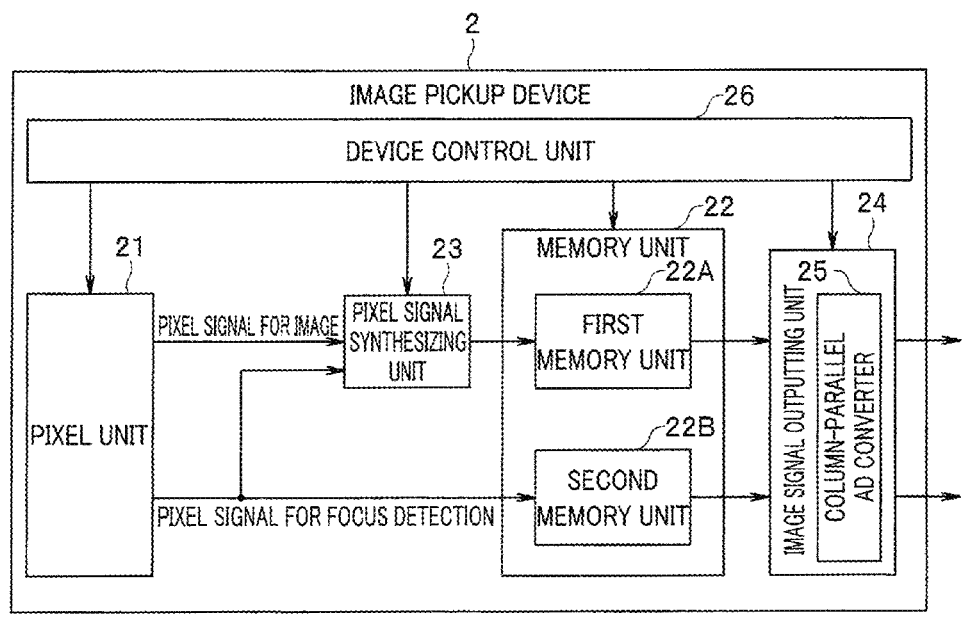
FIG. 14 is a block diagram showing outline of a configuration of an image pickup device according to Embodiment 2 of the present invention.

FIG. 14 to FIG. 17 show Embodiment 2 of the present invention, and FIG. 14 is a block diagram showing outline of the configuration of the image pickup device 2.

In Embodiment 2, the same reference numerals are assigned to parts which are the same as those in the above-described Embodiment 1, explanation thereof will be omitted as appropriate, and only different points will be mainly described.

While, in FIG. 2 in the above-described Embodiment 1, the pixel signal synthesizing unit 23 is disposed after the first memory unit 22A which is the first analog memory, in the present embodiment, the pixel signal synthesizing unit 23 is disposed before the first memory unit 22A.

That is, as shown in FIG. 14, pixel signals for image and pixel signals for focus detection outputted from the pixel unit 21 are inputted to the pixel signal synthesizing unit 23 and first synthesized through pixel addition, or the like. Therefore, when interpolation readout is performed in the present embodiment, it is performed when readout is performed from the pixel unit 21.

The first memory unit 22A then stores synthesized pixel signals for image generated by the pixel signal synthesizing unit 23, and the image signal outputting unit 24 outputs the synthesized pixel signals for image read out from the first memory unit 22A and the pixel signals for focus detection stored in the second memory unit 22B as image signals.

Figure 15:
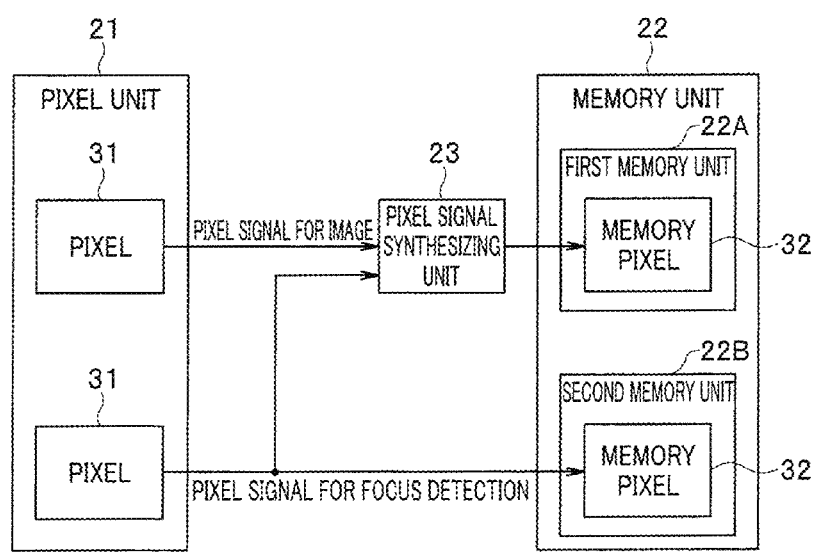
FIG. 15 is a block diagram showing a state where a pixel signal for image and a pixel signal for focus detection are transferred from a pixel of a pixel unit to memory pixels of a first memory unit and a second memory unit according to Embodiment 2.

Subsequently, FIG. 15 is a block diagram showing a state where a pixel signal for image and a pixel signal for focus detection are transferred from the pixel 31 of the pixel unit 21 to the memory pixels 32 of the first memory unit 22A and the second memory unit 22B.

The pixel signals for image read out from the pixels 31 for image in the pixel unit 21 are inputted to the pixel signal synthesizing unit 23. Further, the pixel signals for focus detection to be synthesized with the pixel signals for image among the pixel signals for focus detection read out from the pixels 31 for focus detection in the pixel unit 21 are also inputted to the pixel signal synthesizing unit 23. In this manner, the pixel signals for image and the pixel signals for focus detection inputted to the pixel signal synthesizing unit 23 are synthesized and stored in the memory pixels 32 of the first memory unit 22.

Further, the pixel signals for focus detection read out from the pixels 31 for focus detection in the pixel unit 21 are stored in the memory pixels 32 of the second memory unit 22B. Therefore, output of a given pixel 31 of attention for focus detection is transferred to and stored in two locations of the memory pixel 32 of the first memory unit 22A and the memory pixel 32 of the second memory unit 22B.

Here, because the synthesized pixel signals for image outputted from the pixel signal synthesizing unit 23 are subjected to addition or interpolation, the number of pixels of the synthesized pixel signals is smaller than the total number of pixels of the pixel unit 21. Therefore, memory capacity required for the first memory unit 22A changes according to modes of addition and interpolation.

Therefore, in the present embodiment, the first memory unit 22A and the second memory unit 22B are respectively configured as one part of the memory unit 22 and another part of the memory unit 22, a partition line for partitioning the memory unit 22 into the first memory unit 22A and the second memory unit 22B is made variable, and the partition line is changed according to the number of pixels included in the unit pixels (and, thus, the number of synthesized pixel signals for image). This point will be described with reference to FIG. 16 and FIG. 17.

Figure 16:
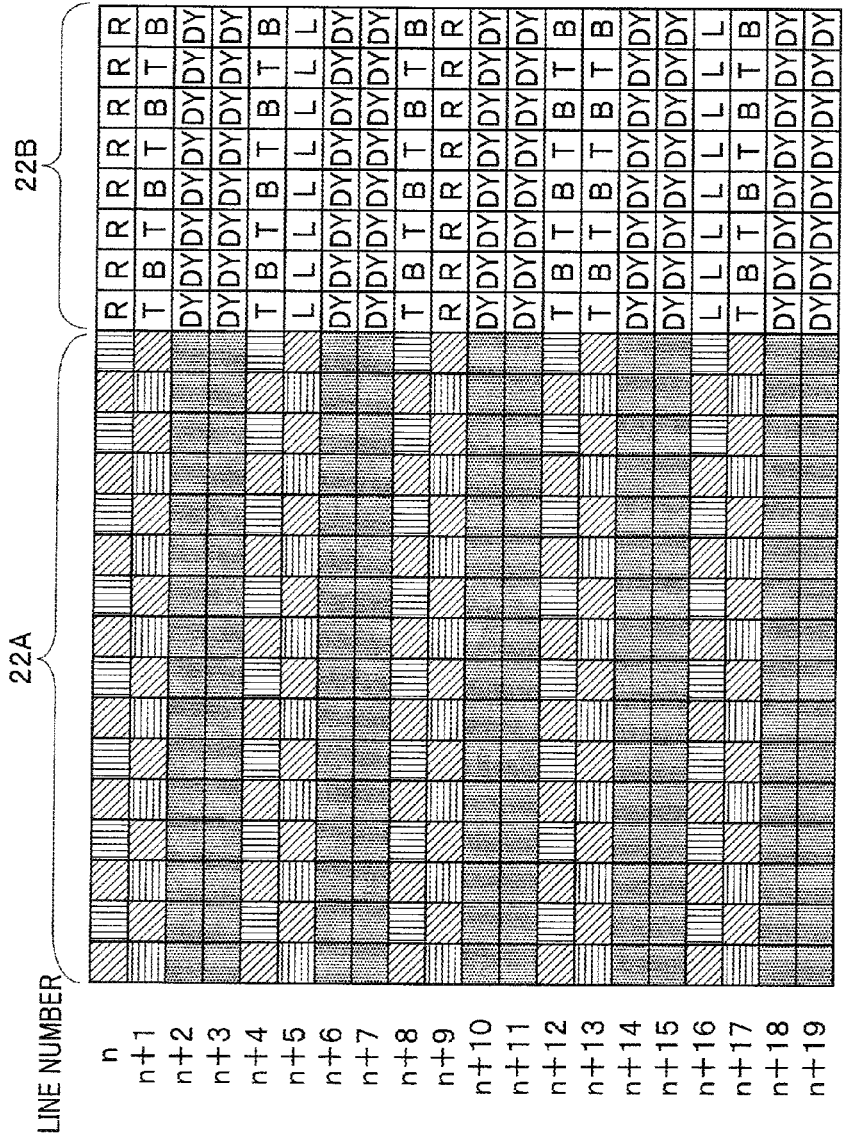
FIG. 16 is a diagram showing arrangement of pixel signals of the first memory unit and the second memory unit upon V2/2, H2/2 addition readout according to Embodiment 2.

First, FIG. 16 is a diagram showing arrangement of the pixel signals of the first memory unit 22A and the second memory unit 22B upon V2/2, H2/2 addition readout.

Pixel signals of 2×2 pixels obtained by performing V2/2, H2/2 addition on pixel signals of the unit pixel PU of 4×4 pixels of the same color as shown in FIG. 8 are sequentially stored in the first memory unit 22, for example, two in every four lines. Here, if the pixels for focus detection are included at positions of pixels to be added with pixels of the same color, as described above, the synthesized pixel signals for image indicated by diagonal hatching, vertical hatching and horizontal hatching in the first memory unit 22A also include the pixel signals for focus detection as elements to be synthesized.

In the case of V2/2, H2/2 addition, the number of columns of the synthesized pixel signals for image is half the number of columns of the pixels signals for image upon readout of all the pixels. Therefore, the pixel signals of 32 columns shown in FIG. 8 becomes pixel signals of 16 columns as shown in FIG. 16, and pixel signals in this 16 columns correspond to the first memory unit 22A, and pixel signals in 17th column and thereafter correspond to the second memory unit 22B, and the partition line between the first memory unit 22A and the second memory unit 22B is changed from that upon readout of all the pixels.

Further, the pixel signals for focus detection are stored in the same line as that of the synthesized pixel signals for image, and a frame rate can be made double the frame rate upon readout of all the pixels as described above.

Figure 17:
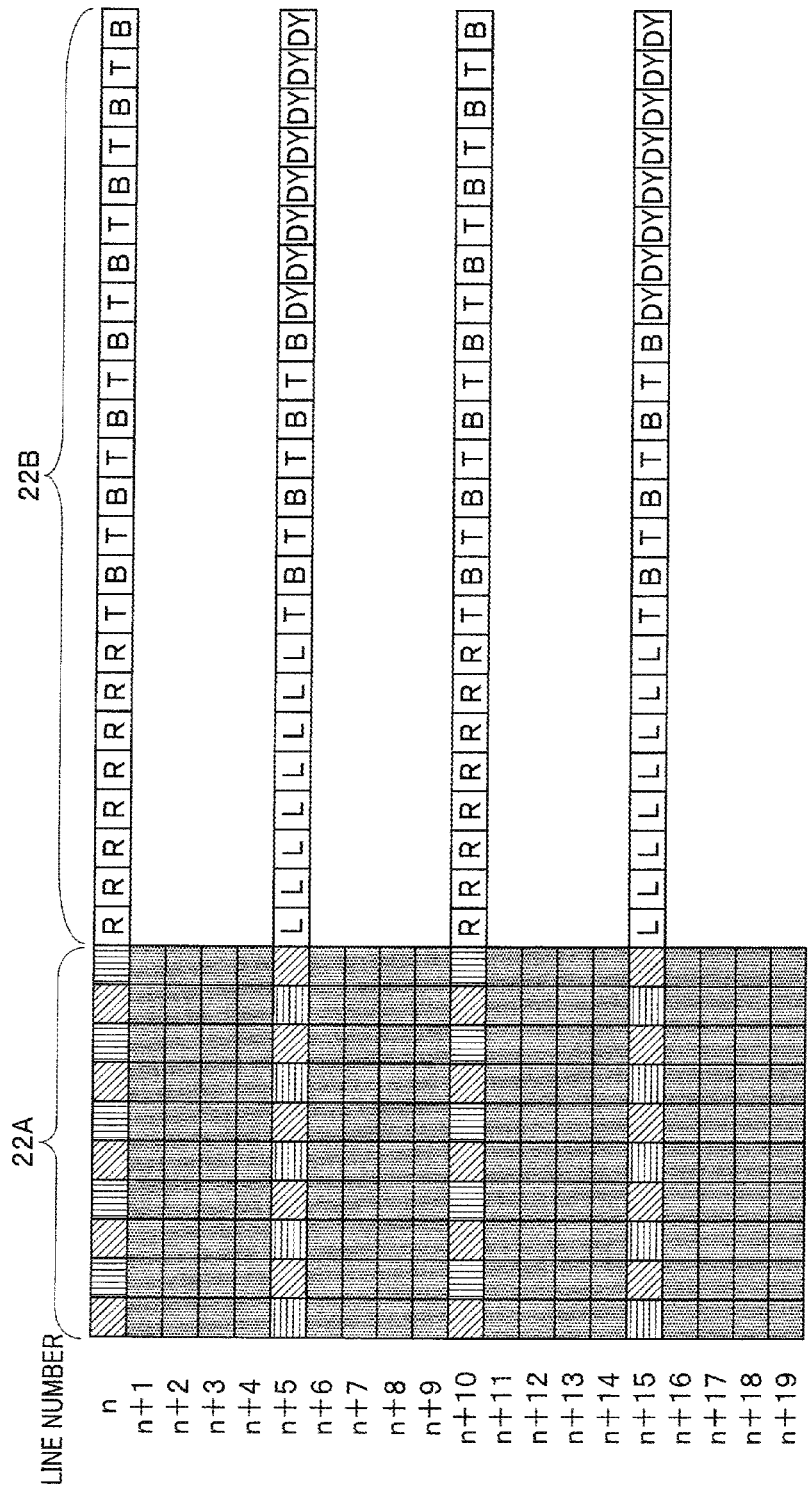
FIG. 17 is a diagram showing arrangement of pixel signals of the first memory unit and the second memory unit upon V1/5, H3/3 addition readout according to Embodiment 2.

Next, FIG. 17 is a diagram showing arrangement of the pixels signals of the first memory unit 22A and the second memory unit 22B upon V1/5, H3/3 addition readout. Note that, in FIG. 17, illustration of a line including only dummy data DY in the second memory unit 22B is omitted (and the same applies in a similar manner below).

Pixel signals of 2×2 pixels obtained by performing V1/5, H3/3 addition on pixel signals of the same color of the unit pixels PUb, PUr of 6×10 pixels as shown in FIG. 9 are sequentially stored in the first memory unit 22A, for example, two in every 10 lines (more specifically, one in every five lines). Here, if the pixels for focus detection are included at positions of the pixels to be added with pixels of the same color, as described above, in the first memory unit 22A, the synthesized pixel signals for image indicated with diagonal hatching, vertical hatching and horizontal hatching also include the pixel signals for focus detection as elements to be synthesized. In the case of V1/5, H3/3 addition, the number of columns of the synthesized pixel signals for image is ⅓ of the number of columns of the pixel signals for image upon readout of all the pixels. Therefore, the pixel signals of 32 columns shown in FIG. 9 becomes pixel signals of 10 columns as shown in FIG. 17 (because the unit pixels PUb are shifted from the unit pixels PUr by two pixels in the horizontal direction as shown in FIG. 9, (32−2)/3=10 columns), and pixels in this ten columns correspond to the first memory unit 22A, and pixels in 11th column and thereafter correspond to the second memory unit 22B, and the partition line of the first memory unit 22A and the second memory unit 22B is changed from that upon readout of all the pixels and that upon V2/2, H2/2 addition readout.

Further, the pixel signals for focus detection are stored in the same line as that of the synthesized pixel signals for image, and a frame rate can be made approximately five times as that in the case of readout of all the pixels as described above.

According to Embodiment 2, it is possible to provide substantially the same advantages as those of the above-described Embodiment 1, and because the pixel signal synthesizing unit 23 is disposed before the first memory unit 22A and the partition line for partitioning the memory unit 22 into the first memory unit 22A and the second memory unit 22B is changed according to the number of pixels included in the unit pixels (and thus the number of synthesized pixel signals for image), it is possible to effectively reduce memory capacity required for the memory unit 22.

Embodiment 3

Figure 18:
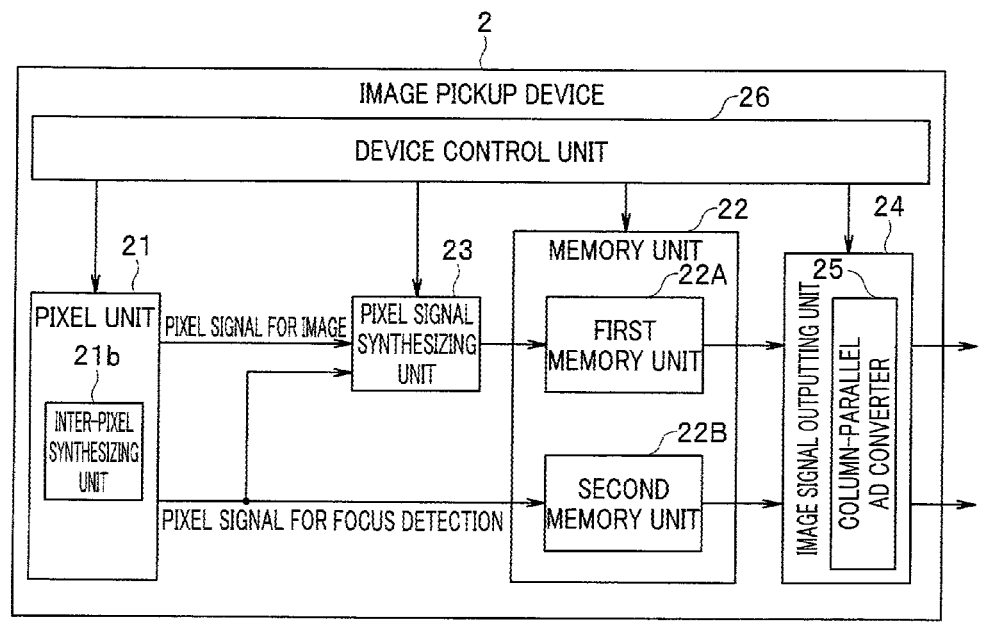
FIG. 18 is a block diagram showing outline of a configuration of an image pickup device according to Embodiment 3 of the present invention.
Figure 19:
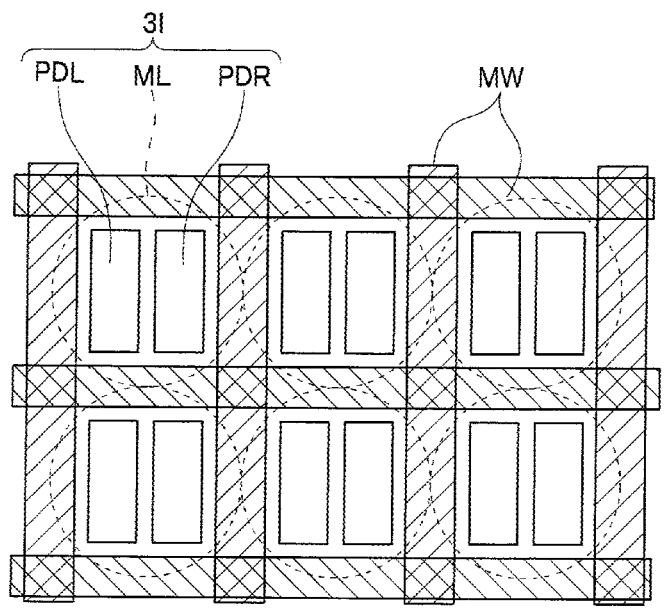
FIG. 19 is a diagram showing a configuration of pixels according to Embodiment 3.

FIG. 18 to FIG. 25 show Embodiment 3 of the present invention, and FIG. 18 is a block diagram showing outline of the configuration of the image pickup device 2, and FIG. 19 is a diagram showing a configuration of the pixel 31.

In Embodiment 3, the same reference numerals are assigned to the same parts as those in the above-described Embodiments 1 and 2, explanation thereof will be omitted as appropriate, and only different points will be mainly described.

In the above-described Embodiments 1 and 2, the pixel 31 of the pixel unit 21 includes two types of a pixel for image and a pixel for focus detection. On the other hand, in the present embodiment, one pixel includes both functions as a pixel for image and a pixel for focus detection.

First, as shown in FIG. 19, the pixel 31 includes a photo diode PDR for performing photoelectric conversion on light beam passing through a right side of a pupil of the lens 1, a photo diode PDL for performing photoelectric conversion on light beam passing through a left side of the pupil of the lens 1, and a micro lens ML for collecting light beam from the lens 1 to the photo diodes PDR and PDL. Further, the periphery of each pixel 31 is surrounded by metal wiring MW and the size of opening of the pixel is restricted.

Note that while, here, the photo diodes PDR and PDL for detecting a phase difference in the horizontal direction are provided as an example, it is also possible to provide a photo diode for performing photoelectric conversion on light beam passing through an upper side of the pupil of the lens 1 and a photo diode for performing photoelectric conversion on light beam passing through a lower side of the pupil of the lens 1 in addition to the photo diodes PDR and PDL, and, the configuration is not limited to these, and it is also possible to provide pixels for focus detection for detecting phase differences in a right diagonal direction, a left diagonal direction or other directions.

As shown in FIG. 18, an inter-pixel synthesizing unit 21b is provided within the pixel unit 21. Note that while FIG. 18 shows an example where the pixel signal synthesizing unit 23 is disposed before the first memory unit 22A as with the above-described Embodiment 2, the pixel signal synthesizing unit 23 may be disposed after the first memory unit 22A as in Embodiment 1.

The photo diode PDR and the photo diode PDL can perform readout electrically independently. Therefore, when the pixel 31 is made to function as a pixel R for focus detection, the inter-pixel synthesizing unit 21b is controlled to read out only pixel signals accumulated in the photo diode PDR. Further, when the pixel 31 is made to function as a pixel L for focus detection, the inter-pixel synthesizing unit 21b is controlled to read out only pixel signals accumulated in the photo diode PDL.

On the other hand, when the pixel 31 is made to function as a normal pixel for image, the inter-pixel synthesizing unit 21b in the pixel unit 21 may be controlled to synthesize pixel signals accumulated in the photo diode PDR and pixel signals accumulated in the photo diode PDL and read out the synthesized pixel signals. However, in this case, it is impossible to separate pixel signals of the pixels R for focus detection and pixel signals of the pixels L for focus detection from the synthesized pixel signals again and read out the pixel signals. Therefore, when it is necessary to synthesize the pixel signals of the pixels R for focus detection and the pixel signals of the pixels L for focus detection as normal pixel signals for image, the pixel signals of the pixels R for focus detection and the pixel signals of the pixels L for focus detection are basically respectively read out from the pixel unit 21, and synthesized at the pixel signal synthesizing unit 23 shown in FIG. 18. With this configuration, one pixel 31 serves a plurality of functions.

Figure 20:
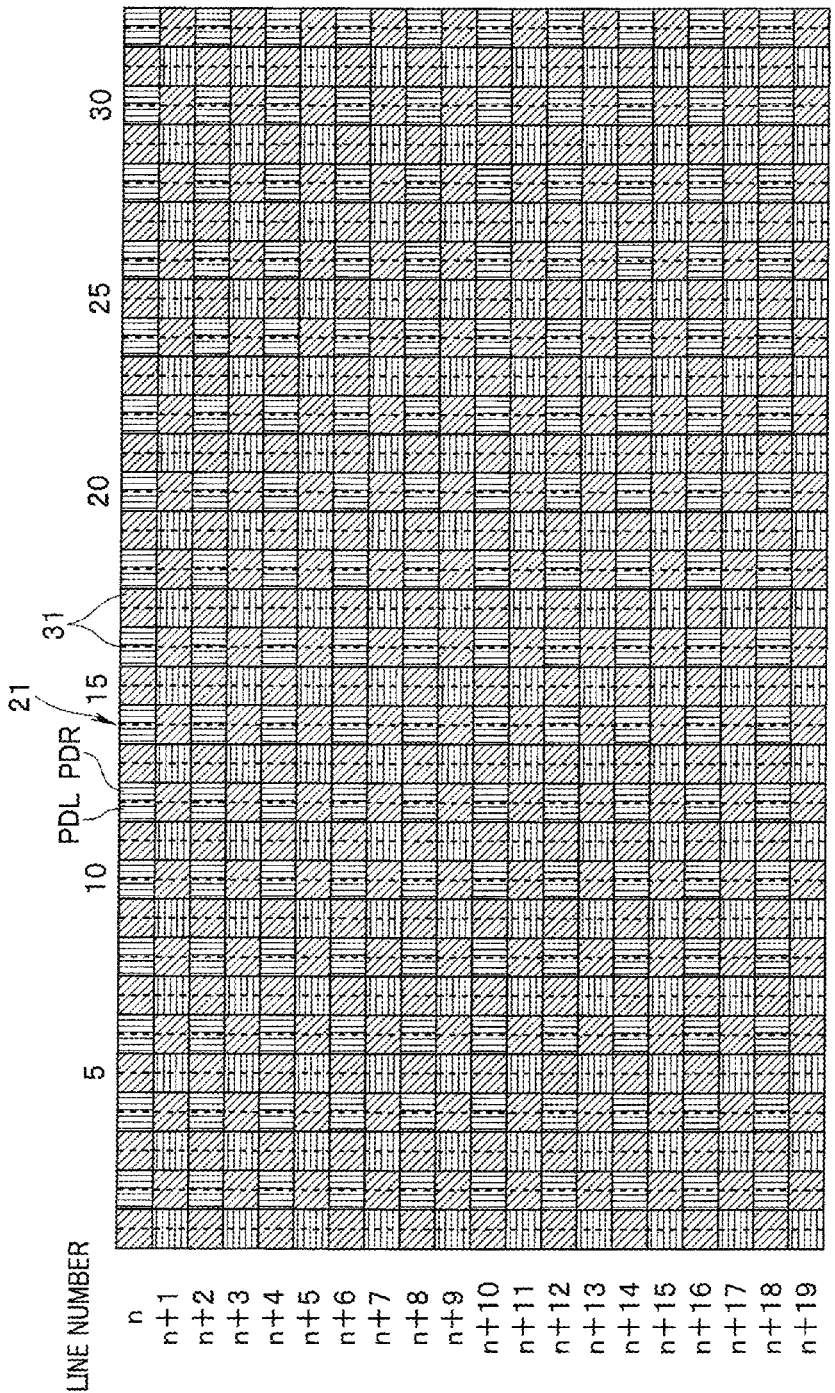
FIG. 20 is a diagram showing a primary color Bayer color filter arrangement of a pixel unit according to Embodiment 3.

FIG. 20 is a diagram showing a primary color Bayer color filter array of the pixel unit 21.

The primary color Bayer color filter array of the pixel unit 21 is the same as a typical primary color Bayer array in which a color filter of any of red, blue and green is arranged in one pixel 31 except that one pixel 31 is divided into the photo diode PDR and the photo diode PDL.

Figure 21:
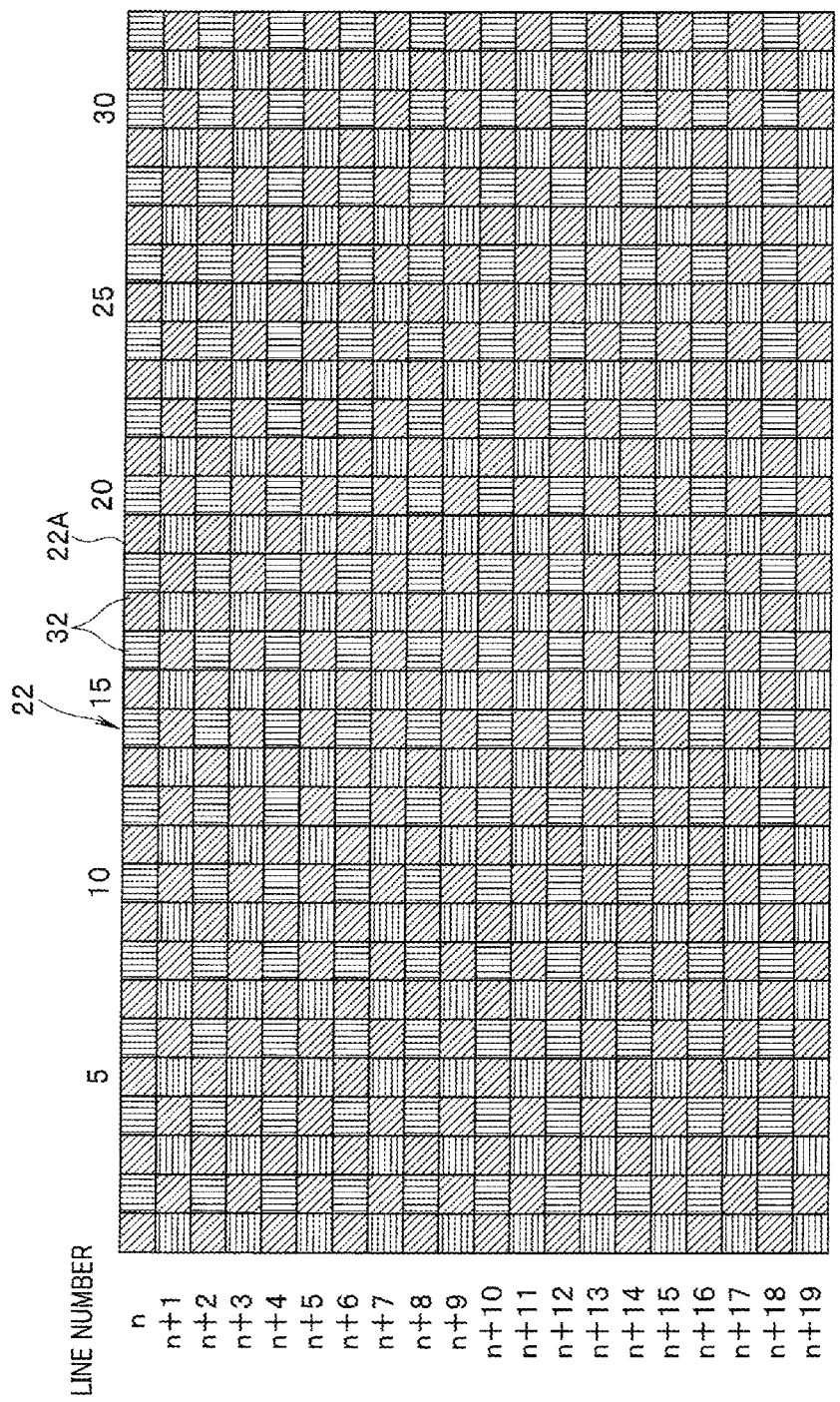
FIG. 21 is a diagram showing a state of pixel signals stored in a first memory unit when all the pixels are normally read out from the pixel unit according to Embodiment 3.

FIG. 21 is a diagram showing a state of pixel signals stored in the first memory unit 22A when all the pixels are normally read out from the pixel unit 21. FIG. 21 shows a case where it is not necessary to read out pixel signals for focus detection, for example, a case where a still image is read out. Accordingly, the read out pixel signals for focus detection are not stored in the second memory unit 22B, for example.

Figure 22:
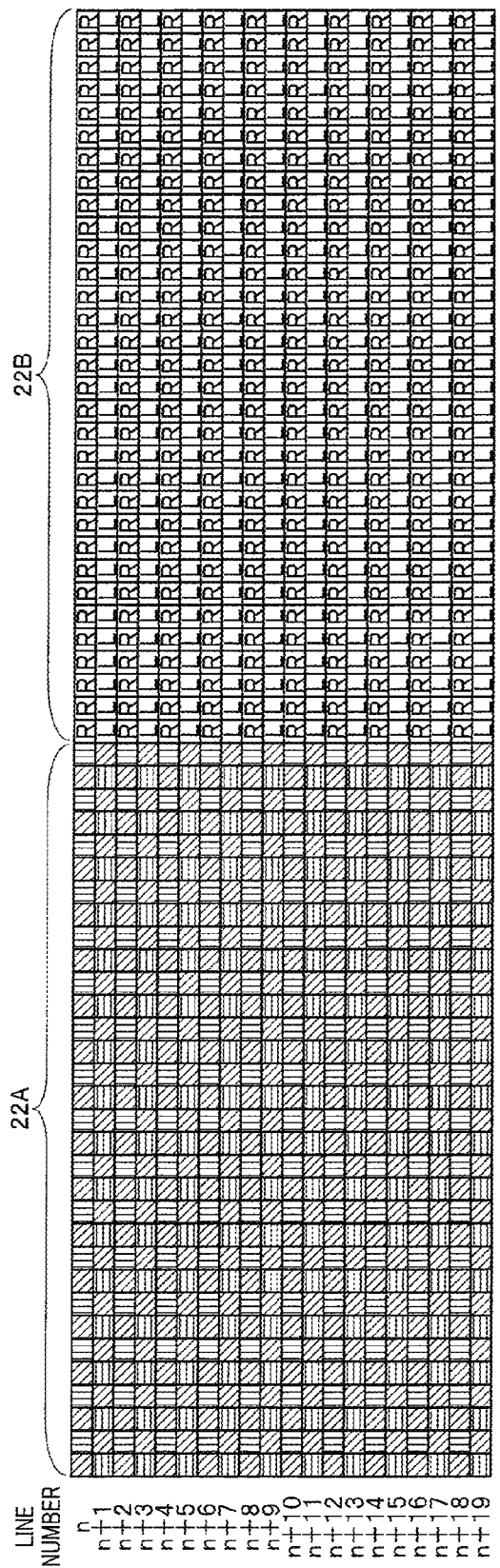
FIG. 22 is a diagram showing a state of a memory unit when all the pixels are read out from the pixel unit, and, further, for example, pixel signals of pixels R for focus detection and pixel signals of pixels L for focus detection relating to all green pixels are read out from the pixel unit according to Embodiment 3.

Further, FIG. 22 is a diagram showing a state of the memory unit 22 when all the pixels are read out from the pixel unit 21, and, further, for example, pixel signals of pixels R for focus detection and pixel signals of pixels L for focus detection relating to all the green pixels are read out from the pixel unit 21. Here, for example, pixel signals of pixels R for focus detection are read out from the photo diode PDR for green pixels in the line n and the line (n+1), and stored in the line n of the second memory unit 22B, and pixel signals of pixels L for focus detection are read out from the photo diode PDL respectively corresponding to the above-described photo diode PDR for green pixels in the line n and the line (n+1) (that is, within each same pixel 31) and stored in the line (n+1) of the second memory unit 22B. Therefore, the number of memory pixels 32 of the first memory unit 22A is the same as the number of memory pixels 32 of the second memory unit 22B.

Figure 23:
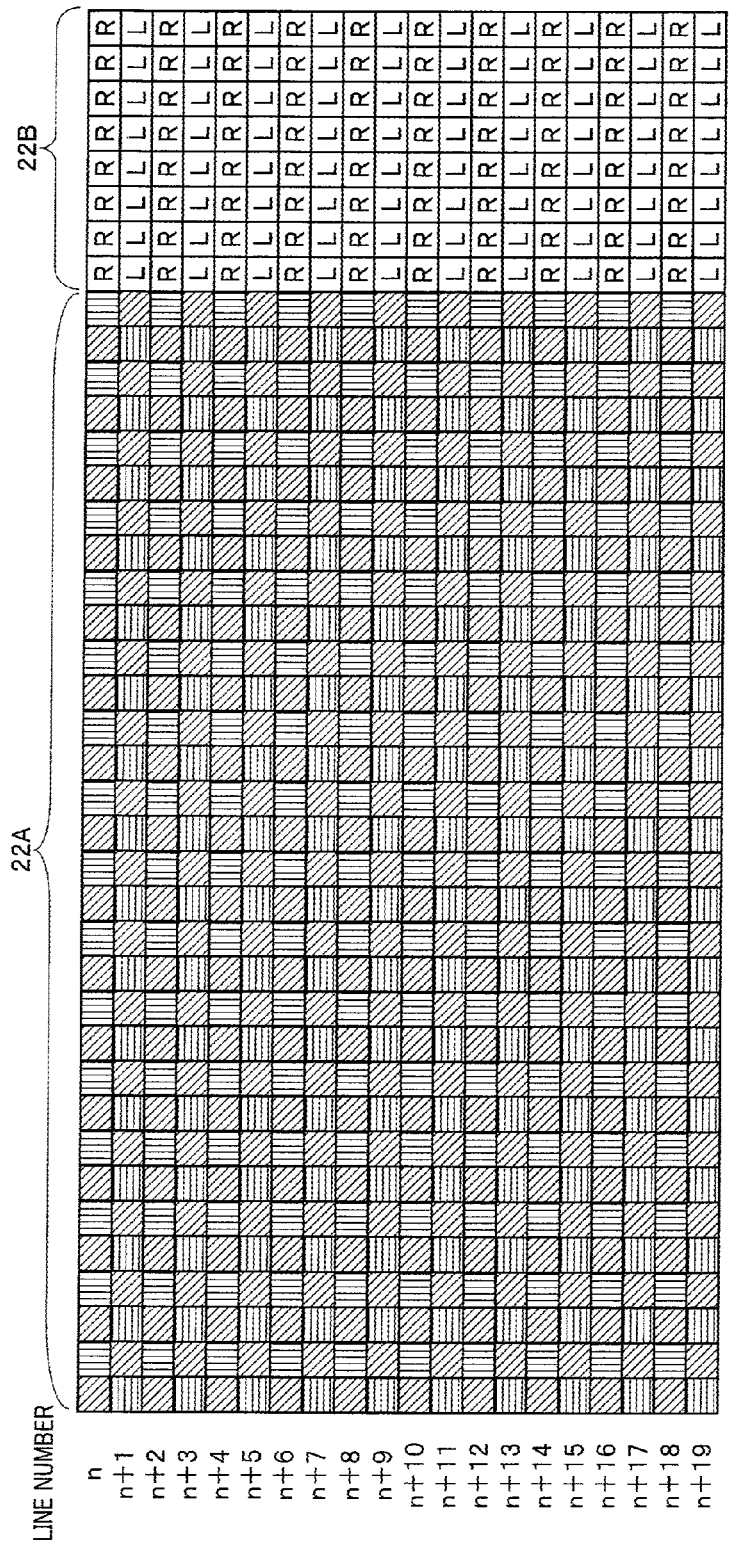
FIG. 23 is a diagram showing a state of a memory unit when all the pixels are read out from the pixel unit while restricting an AF region according to Embodiment 3.

Further, FIG. 23 is a diagram showing a state of the memory unit 22 when all the pixels are read out from the pixel unit 21 while an AF region 21a is restricted.

First, setting of the AF region 21a (restriction to a specific partial region in the pixel unit 21) is, as described above, automatically performed by the camera control unit 12 based on detection of an object, or the like, or manually performed by a user through the camera operation unit 11.

While the first memory unit 22A in which pixel signals for image for which all the pixels are read out are stored is the same as that in the example shown in FIG. 22, because pixels for focus detection are read out from only the restricted AF region 21a, the number of pixel signals for focus detection stored in the first memory unit 22A is substantially reduced from that in the example shown in FIG. 22.

Figure 24:
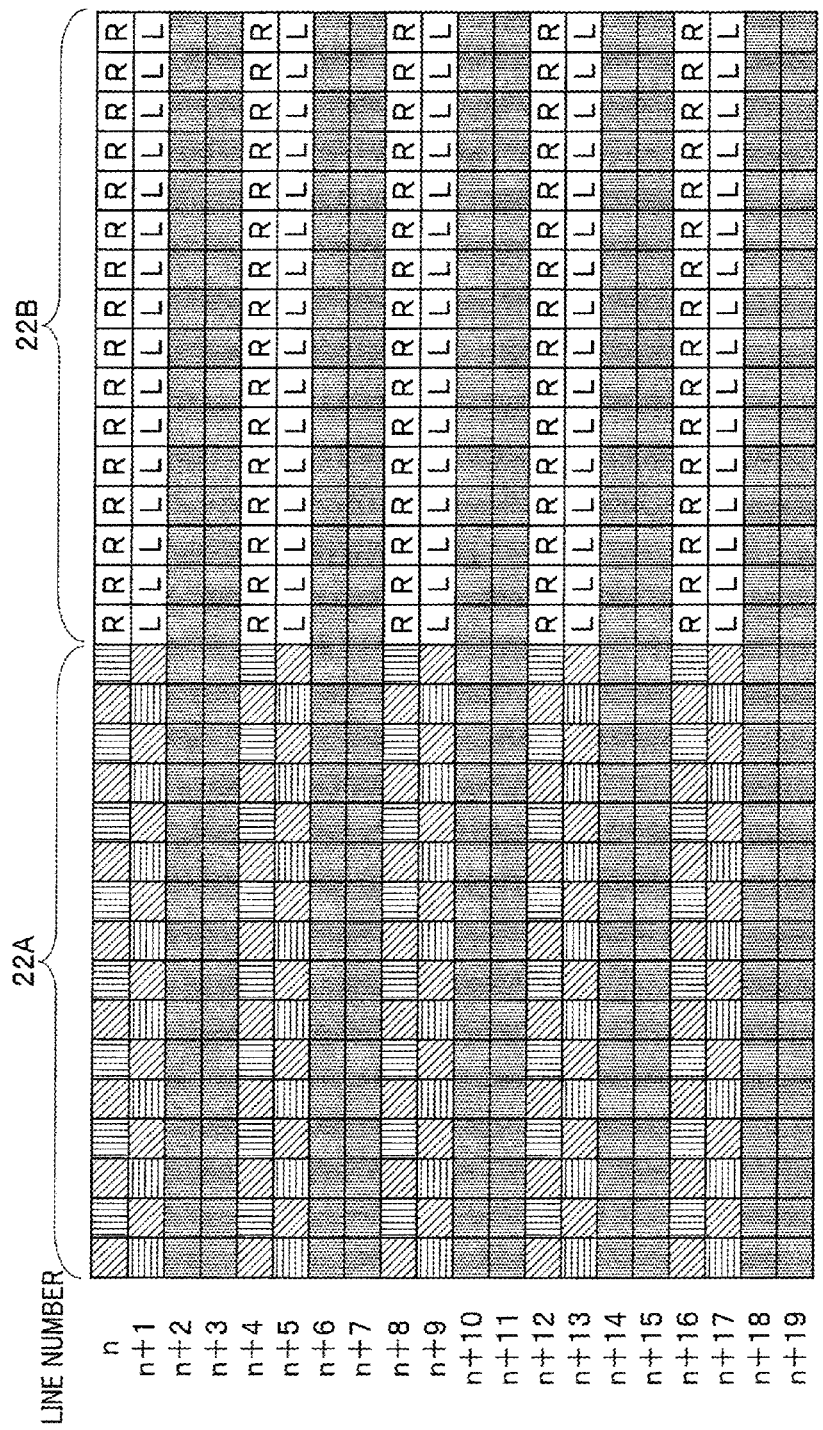
FIG. 24 is a diagram showing arrangement of pixel signals of the first memory unit and the second memory unit upon V2/2, H2/2 addition readout according to Embodiment 3.

Next, FIG. 24 is a diagram showing arrangement of the pixel signals of the first memory unit 22A and the second memory unit 22B upon V2/2, H2/2 addition readout.

The arrangement of the synthesized pixel signals for image stored in the first memory unit 22A in this case are the same as the arrangement shown in FIG. 16 in the above-described Embodiment 2. However, because pixels R for focus detection and pixels L for focus detection are not configured with a light-shielding structure, decrease in output due to synthesis of the pixels for focus detection or image distortion due to shift of the focus position does not occur.

Further, while a configuration in which the pixel signals for focus detection are stored in the same line as that for the synthesized pixel signals for image is the same as that in the example shown in FIG. 16, in the present embodiment, because all the pixels 31 can be pixels for focus detection, the number of pixel signals for focus detection stored in the second memory unit 22B is larger than that in the example shown in FIG. 16. Specifically, here, respective pixel signals of pixels R and L for focus detection are acquired from only green pixels on the same line as that for the red pixels, or pixels obtained by adding pixel signals of the photo diode PDR of two green pixels which are adjacent in a diagonal direction are used as pixels R for focus detection, or pixels obtained by adding pixel signals of the photo diode PDL are used as pixels L for focus detection.

At this time, when focus detection is focus detection for synthesized image such as live view and movie shooting, the number of pixel signals for focus detection stored in the second memory unit 22B is preferably made smaller (more preferably, made smaller to the necessary and sufficient number for focus detection) than the number of pixel signals for focus detection generated by the pixel unit 21 in accordance with decreasing of spatial frequency of the synthesized pixel signals for image generated by the pixel signal synthesizing unit 23. The spatial frequency of the pixel signals is decreased by readout control of the pixel unit 21 by the device control unit 26, or through processing of the pixel signal synthesizing unit 23. By this means, the spatial frequency of the pixel signals for focus detection becomes spatial frequency according to the spatial frequency of pixel signals for image, which suppresses acquisition of excessive high-definition pixel signals for focus detection, so that it is possible to effectively reduce memory capacity of the second memory unit 22B. Further, because the number of operating AD converters 25 can be reduced, it is also possible to reduce power consumption of the image pickup device 2. On the other hand, when focus detection is focus detection for still image shooting (for example, when a first stage of a release button which is a two-stage operation button is depressed to acquire a still image even during live view), it is preferable to output the pixel signals for focus detection having spatial frequency according to the spatial frequency of the pixel signals for still image from the image pickup device 2. The spatial frequency of the pixel signals to be outputted from the image pickup device 2 is controlled by the device control unit 26 which receives instructions from the camera control unit 12 and the exposure control unit 9.

In this manner, it is preferable to make the spatial frequency of the pixel signals for focus detection to be outputted from the image pickup device 2 lower than the spatial frequency of the pixel signals for focus detection generated by the pixel unit 21 according to application of the pixel signals for focus detection (such as whether for still image or for movie).

Figure 25:
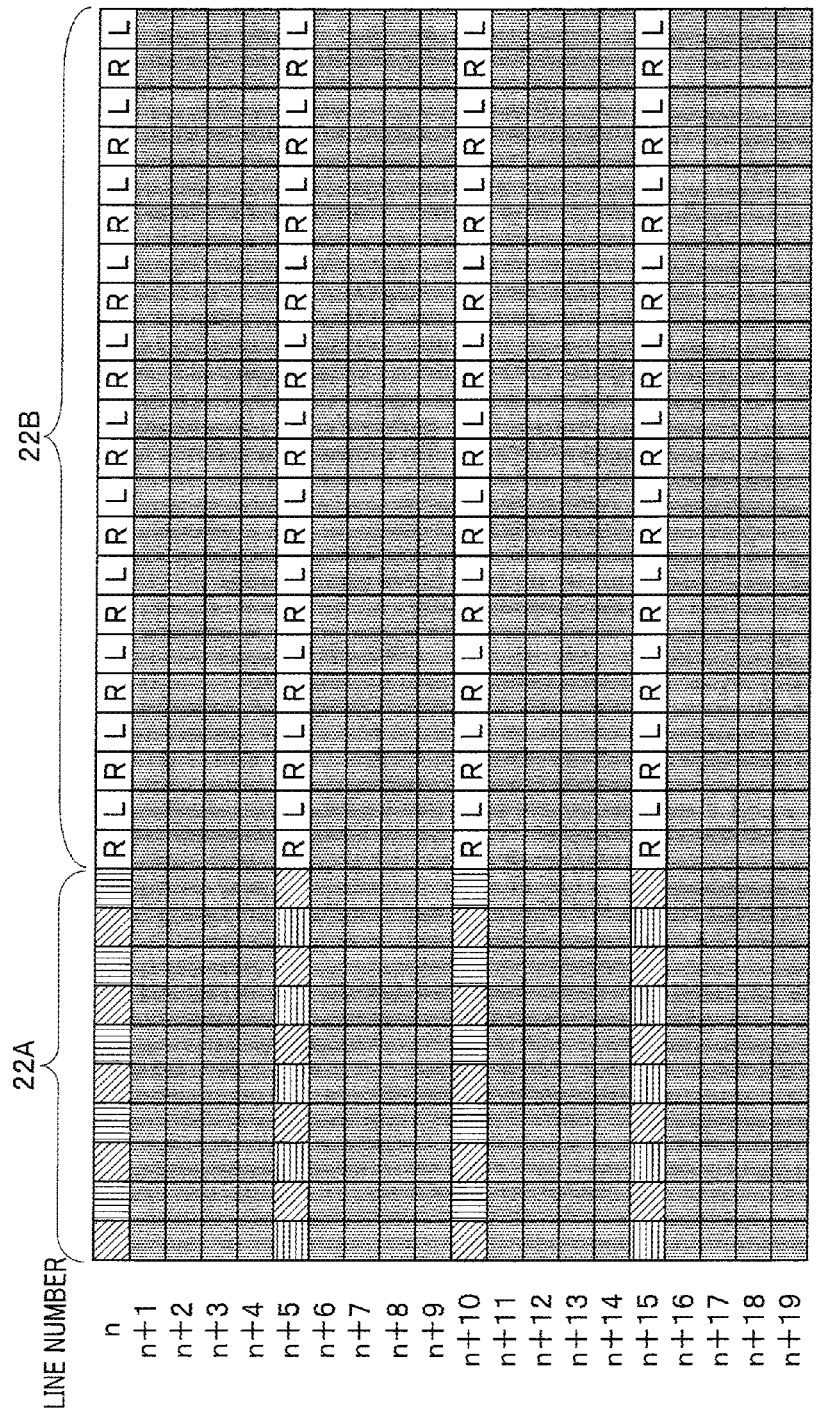
FIG. 25 is a diagram showing arrangement of pixel signals of the first memory unit and the second memory unit upon V1/5, H3/3 addition readout according to Embodiment 3.

Subsequently, FIG. 25 is a diagram showing arrangement of the pixel signals of the first memory unit 22A and the second memory unit 22B upon V1/5, H3/3 addition readout.

In this case, arrangement of the synthesized pixel signals for image stored in the first memory unit 22A is the same as arrangement shown in FIG. 17 in the above-described Embodiment 2. However, because pixels R for focus detection and pixels L for focus detection are not configured with a light-shielding structure, decrease in output due to synthesis of the pixels for focus detection or image distortion due to shift of the focus position does not occur.

Further, in the example shown in FIG. 25, the AF region 21a is restricted, and the pixel signals for focus detection read out from the green pixels in the restricted AF region 21a are stored in the second memory unit 22B one in every five lines.

According to Embodiment 3, because it is possible to provide substantially the same advantages as those in the above-described Embodiments 1 and 2, and the spatial frequency of the pixel signals for focus detection to be outputted from the image pickup device 2 is made lower according to application (such as whether for still image or for movie), for example, even during live view, it is possible to output pixel signals for focus detection having high spatial frequency from the image pickup device 2 when the first stage of the release button is depressed to acquire a still image. Further, because the number of pixel signals for focus detection stored in the second memory unit 22B is reduced in accordance with decrease in the spatial frequency of the pixel signals for image by synthesis, it is possible to effectively reduce memory capacity of the second memory unit 22B and reduce power consumption of the image pickup device 2.

Further, because only the pixel signals for focus detection read out from the selected AF region 21a are stored in the second memory unit 22B, in a similar manner, it is possible to effectively reduce memory capacity of the second memory unit 22B and reduce power consumption of the image pickup device 2.

Further, in the pixel unit 21 in which the pixels 31 having the photo diodes PDR and PDL for generating pixel signals for image and pixel signals for focus detection are arranged in a matrix, it is possible to provide the above-described advantages.

Having described the preferred embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. An image pickup device comprising:
    a pixel unit in which pixels are arranged in a matrix, and, further, when a plurality of the pixels which are adjacent are regarded as unit pixels, the unit pixels are arranged in a matrix, and which generates pixel signals for image and pixel signals for focus detection;
    a pixel signal synthesizing unit which generates pixel signals for image by synthesizing at least the pixel signals for image generated from pixels within the unit pixels;
    a first analog memory which stores the synthesized pixel signals for image generated by the pixel signal synthesizing unit when the pixel signal synthesizing unit is disposed before the first analog memory, and at least the pixel signals for image read out from the pixel unit when the pixel signal synthesizing unit is disposed after the first analog memory;
    a second analog memory which stores the pixel signals for focus detection; and
    an image signal outputting unit which outputs as image signals, the synthesized pixel signals for image read out from the first analog memory when the pixel signal synthesizing unit is disposed before the first analog memory, and the synthesized pixel signals for image generated by the pixel signal synthesizing unit when the pixel signal synthesizing unit is disposed after the first analog memory, and the pixel signals for focus detection stored in the second analog memory.

2. The image pickup device according to claim 1, wherein the image signal outputting unit comprises a column-parallel AD converter in which AD converters are arranged in respective columns for reading out pixel signals simultaneously, a group of pixel signals in which only the synthesized pixel signals for image are arrayed and a group of pixel signals in which only the pixel signals for focus detection are arrayed being arranged in series for each row configured with the unit pixels so that the column-parallel AD converter performs AD conversion.

3. The image pickup device according to claim 2, wherein the first analog memory and the second analog memory are respectively configured as one part of a memory unit and another part of the memory unit, and a partition line for partitioning the memory unit into the first analog memory and the second analog memory is variable, and when the pixel signal synthesizing unit is disposed before the first analog memory, the partition line is changed according to the number of pixels included in the unit pixels.

4. The image pickup device according to claim 2, wherein spatial frequency of the pixel signals for focus detection outputted from the image pickup device is made lower than spatial frequency of the pixel signals for focus detection generated by the pixel unit according to application of the pixel signals for focus detection.

5. The image pickup device according to claim 4, wherein the number of the pixel signals for focus detection stored in the second analog memory is made smaller than the number of the pixel signals for focus detection generated by the pixel unit in accordance with decreasing of spatial frequency of the synthesized pixel signals for image generated by the pixel signal synthesizing unit.

6. The image pickup device according to claim 2, further comprising:

a focus detection pixel region selecting unit which selects an AF region from which the pixel signals for focus detection are to be read out from the pixel unit,
wherein only the pixel signals for focus detection read out from the selected AF region are stored in the second analog memory.

7. The image pickup device according to claim 2, wherein the image signal outputting unit stops operation of an AD converter which is not used for AD conversion of pixel signals among the AD converters arranged in the column-parallel AD converter.

8. The image pickup device according to claim 1, wherein the pixel signal synthesizing unit generates pixel signals for image by further synthesizing the pixel signals for focus detection generated from the pixels within the unit pixels in addition to the pixel signals for image generated from the pixels within the unit pixels, and when the pixel signal synthesizing unit is disposed after the first analog memory, the first analog memory further stores the pixel signals for focus detection read out from the pixel unit.

9. The image pickup device according to claim 1, wherein, in the pixel unit, pixels for generating the pixel signals for image and pixels for generating the pixel signals for focus detection are arranged in a matrix.

10. The image pickup device according to claim 1, wherein, in the pixel unit, pixels for generating the pixel signals for image and the pixel signals for focus detection are arranged in a matrix.

11. An image pickup apparatus comprising:

the image pickup device according to claim 1;
an image pickup optical system which forms an optical image on the image pickup device and for which a focus position can be adjusted; and
a focus detection control unit which adjusts the focus position of the image pickup optical system based on the pixel signals for focus detection outputted from the image pickup device.

* * * * *